US012648358B2

(12) United States Patent
Takasugi

(10) Patent No.: US 12,648,358 B2
(45) Date of Patent: Jun. 2, 2026

(54) ULTRASONIC TRANSDUCER AND METHOD FOR MANUFACTURING THE SAME

(71) Applicant: Suncall Corporation, Kyoto (JP)

(72) Inventor: Satoru Takasugi, Kyoto (JP)

(73) Assignee: Suncall Corporation, Kyoto (JP)

( * ) Notice: Subject to any disclaimer, the term of this patent is extended or adjusted under 35 U.S.C. 154(b) by 1016 days.

(21) Appl. No.: 17/788,249

(22) PCT Filed: Jan. 30, 2020

(86) PCT No.: PCT/JP2020/003454
§ 371 (c)(1),
(2) Date: Jun. 22, 2022

(87) PCT Pub. No.: WO2021/152776
PCT Pub. Date: Aug. 5, 2021

(65) Prior Publication Data
US 2023/0034997 A1 Feb. 2, 2023

(51) Int. Cl.
*H10N 30/30* (2023.01)
*B06B 1/06* (2006.01)
(Continued)

(52) U.S. Cl.
CPC ............. *H10N 30/302* (2023.02); *B06B 1/06* (2013.01); *H10N 30/857* (2023.02);
(Continued)

(58) Field of Classification Search
CPC .. H10N 30/871; H10N 30/302; H10N 30/883; H10N 30/875; H10N 30/857; B06B 1/0629; B06B 1/06
See application file for complete search history.

(56) References Cited

U.S. PATENT DOCUMENTS

| 10,707,407 B2 * | 7/2020 | Kiyose ................. A61B 8/4494 |
| 2011/0193916 A1 * | 8/2011 | Hirai .................... B41J 2/14233 |
| | | 29/25.35 |

(Continued)

FOREIGN PATENT DOCUMENTS

| JP | 2013-156246 A | 8/2013 |
| JP | 6499097 B2 | 4/2019 |

(Continued)

OTHER PUBLICATIONS

International Search Report issued in PCT/JP2020/003454, mailed Mar. 10, 2020, 2 pages.

*Primary Examiner* — J. San Martin
(74) *Attorney, Agent, or Firm* — Sterne, Kessler, Goldstein & Fox P.L.L.C.

(57) ABSTRACT

An ultrasonic transducer of this invention includes a rigid substrate with opening parts extending between bottom and top surfaces, a flexible resin film fixed to the top surface of the substrate to cover the opening parts, and piezoelectric elements fixed to a top surface of the resin film so as to overlap in a plan view with the opening parts, respectively. An arrangement pitch of the piezoelectric elements is preferably set to be equal to or less than 4.3 mm, and the piezoelectric element may have a rectangular shape in the plan view having longitudinal and lateral dimensions in the plan view with a maximum value of 4.0 mm or less, a circular shape in the plan view having a diameter of 4.0 mm or less, or an elliptical shape in the plan view having a major axis of 4.0 mm or less.

25 Claims, 15 Drawing Sheets

(51) Int. Cl.
    *H10N 30/857*     (2023.01)
    *H10N 30/87*     (2023.01)
    *H10N 30/88*     (2023.01)

(52) U.S. Cl.
    CPC ......... *H10N 30/871* (2023.02); *H10N 30/875*
            (2023.02); *H10N 30/883* (2023.02)

(56)             References Cited

U.S. PATENT DOCUMENTS

| | | | |
|---|---|---|---|
| 2012/0294124 | A1 | 11/2012 | Krohn et al. |
| 2013/0223191 | A1* | 8/2013 | Nakamura ............ B06B 1/0622 |
| | | | 310/334 |
| 2015/0141825 | A1* | 5/2015 | Kiyose .................. B06B 1/0622 |
| | | | 600/443 |
| 2015/0177197 | A1* | 6/2015 | Kojima ................ G01N 29/221 |
| | | | 216/17 |
| 2020/0368779 | A1* | 11/2020 | Satoh .................... B06B 1/0603 |
| 2025/0041900 | A1* | 2/2025 | Takasugi ................ H04R 31/00 |
| 2025/0204257 | A1* | 6/2025 | Takasugi ................ H10N 30/50 |

FOREIGN PATENT DOCUMENTS

| | | | | | |
|---|---|---|---|---|---|
| JP | | 6552149 | B1 | 7/2019 | |
| JP | | 6598417 | B1 * | 10/2019 | ............. H04R 31/00 |
| WO | WO-2019234854 | A1 * | 12/2019 | ............. H04R 31/00 |

* cited by examiner

FIG.14

ULTRASONIC TRANSDUCER AND METHOD FOR MANUFACTURING THE SAME

FIELD OF THE INVENTION

The present invention relates to an air-coupled ultrasonic transducer in which a plurality of piezoelectric elements is arranged in parallel and which can be suitably used as a phased array sensor and a method for manufacturing the same.

BACKGROUND ART

An ultrasonic transducer in which a plurality of vibration bodies each including a piezoelectric element and a vibrating plate are arranged in parallel can be suitably used as a phased array sensor for detecting the shape of an object or detecting the presence or absence of an object over a wide range. In this case, the following matter has been demanded in the ultrasonic transducer.

Specifically, in order to suppress the generation of a grating lobe phenomenon among ultrasonic waves emitted or radiated by the plurality of vibration bodies, the arrangement pitch of the plurality of vibration bodies needs to be set to ½ or less of the wavelength λ of ultrasonic waves emitted from the vibration bodies.

Meanwhile, in order to detect an object in air located ahead by several meters, the frequency of ultrasonic waves emitted from the vibration bodies for use in the ultrasonic transducer needs to be set to a low frequency of about 40 kHz.

In air at room temperature, a wavelength λ of the ultrasonic wave with a frequency of 40 kHz is 8.6 mm. Therefore, in order to suppress the generation of the grating lobe phenomenon in a state where the vibration bodies are configured to emit the ultrasonic waves having the frequency of 40 kHz, the arrangement pitch of the plurality of vibration bodies needs to be set to 8.6 mm/2=4.3 mm or less.

In addition to this, in order to cause the plurality of vibration bodies to emit ultrasonic waves having respective desired frequencies and phases, it is also needed to prevent the vibration propagation among a plurality of vibration bodies as much as possible.

In this respect, the applicant of the present application filed a patent application regarding an ultrasonic transducer including a rigid elastic plate capable of vibrating in the plate thickness direction, a plurality of piezoelectric elements arranged in parallel on the elastic plate and a sealing member provided on the elastic plate so as to cover the plurality of piezoelectric elements, wherein the elastic plate includes a plurality of vibration regions to which the plurality of piezoelectric elements are respectively attached, a plurality of restriction regions respectively surrounding the plurality of vibration regions, and boundary regions demarcating one restriction region and an outer region located outward in the radial direction relative to the one restriction region, and wherein the boundary region has a slit portion dividing one restriction region from the corresponding outer region and a bridge portion maintaining the mechanical connection between the one restriction region and the corresponding outer region, and the patent application has been patented (see Patent Literatures 1 to 3 shown below).

The conventional ultrasonic transducer is useful in that vibration propagation from one vibration region to another vibration region can be effectively prevented tanks to the existence of the slit portion while causing the vibration region to have lowered rigidity by arranging a low rigidity region such as a groove between the vibration region, which vibrates along with the piezoelectric element, and the restriction region. However, the conventional ultrasonic transducer still leaves room for improvement in the following point.

Specifically, although the conventional ultrasonic transducer can lower rigidity of the vibration region by provision of the low rigidity region, it is necessary to expand and contract the piezoelectric element against the rigidity of the rigid substrate on which the piezoelectric element is mounted.

Regarding this point, in the ultrasonic transducer of the type in which the plurality of piezoelectric elements are mounted on the rigid elastic plate, the frequency of the drive voltage applied to the piezoelectric elements is set to a frequency in the vicinity of a resonance frequency of the vibrating body that is formed by the rigid elastic plate and the piezoelectric element mounted on the rigid elastic plate to resonate the vibrating body so that a necessary vibration amount is realized.

Here, in order to use the ultrasonic transducer as the phased array sensor, it is necessary to precisely control phases of ultrasonic waves emitted from the plurality of vibrating bodies. However, a phase of a frequency response of a vibrating operation of the vibration body with respect to the voltage applied to the piezoelectric element changes largely in the vicinity of the resonance frequency of the piezoelectric element in a state of being mounted.

Therefore, to precisely control the phases of the ultrasonic waves emitted by the plurality of piezoelectric elements while setting the frequency of the drive voltage applied to the vibrating bodies to a frequency in the vicinity of the resonance frequency of the vibrating bodies in which the piezoelectric element are respectively mounted, it is necessary to suppress as much as possible "variation" in the resonance frequency among the plurality of vibrating bodies, which is very difficult.

PRIOR ART DOCUMENT

Patent Literature

Patent Literature 1: Japanese Patent No. 6499097
Patent Literature 2: Japanese Patent No. 6552149
Patent Literature 1: Japanese Patent No. 6598417

SUMMARY OF THE INVENTION

The present invention has been made in consideration of the conventional technology, and it is a first object to provide an ultrasonic transducer provided with a plurality of piezoelectric elements arranged in parallel and capable of sufficiently securing vibrations and amplitudes of vibrating bodies in which the plurality of piezoelectric elements are respectively mounted even in a case where a frequency of a drive voltage applied to the piezoelectric elements is set to be lower than the resonance frequency of the vibrating body rather than a frequency in the vicinity of the resonance frequency of the vibrating body.

It is a second object of the present invention to provide a manufacturing method capable of efficiently manufacturing the ultrasonic transducer.

In order to achieve the first object, a first aspect of the present invention provides an ultrasonic transducer including a rigid substrate that is provided with a plurality of opening parts penetrating the rigid substrate between a bottom surface and a top surface thereof; a flexible resin film that is fixed to the top surface of the substrate so as to cover the plurality of opening parts; and a plurality of piezoelectric elements that are fixed to a top surface of the resin film so as to overlap with the plurality of opening parts, respectively, in a plan view.

The ultrasonic transduce according to the first aspect of the present invention makes it possible to sufficiently secure vibrations and amplitudes of vibrating bodies in which the plurality of piezoelectric elements are respectively mounted even in a case where a frequency of a drive voltage applied to the piezoelectric elements is set to be lower than the resonance frequency of the vibrating body rather than a frequency in the vicinity of the resonance frequency of the vibrating body.

Therefore, the ultrasonic transduce makes it possible to precisely control the phases of the ultrasonic waves generated by the plurality of vibrating bodies without strictly matching the resonance frequencies of the plurality of vibration bodies.

In a preferable configuration, an arrangement pitch of the plurality of piezoelectric elements is equal to or less than 4.3 mm, and the piezoelectric element is configured to have a rectangular shape in the plan view having longitudinal and lateral dimensions in the plan view with a maximum value of 4.0 mm or less, a circular shape in the plan view having a diameter of 4.0 mm or less, or an elliptical shape in the plan view having a major axis of 4.0 mm or less.

In a more preferable configuration, the piezoelectric element is arranged so that its entire circumference is overlapped with the rigid substrate in the plan view, and an overlapping width between the piezoelectric element and the rigid substrate is set to be 0.03 mm to 0.07 mm.

The ultrasonic transducer according to the first aspect of the present invention makes it possible to sufficiently secure vibrations and amplitudes of vibrating bodies in which the plurality of piezoelectric elements are respectively mounted even in a case where a frequency of a drive voltage applied to the piezoelectric elements is set to be lower than the resonance frequency of the vibrating body rather than a frequency in the vicinity of the resonance frequency of the vibrating body.

Therefore, the ultrasonic transducer makes it possible to precisely control the phases of the ultrasonic waves generated by the plurality of vibrating bodies without strictly matching the resonance frequencies of the plurality of vibration bodies.

The ultrasonic transducer according to any one of the above various configurations preferably may further include a lower sealing plate that includes a central opening with a size surrounding an opening part forming region of the rigid region in which the plurality of opening parts of the rigid substrate are formed, and that is fixed to the top surface of the flexible resin film so that the central opening surrounds the opening part forming region in the plan view; and a wiring assembly fixed to a top surface of the lower sealing plate.

The wiring assembly includes an insulating base layer, first and second conductor layers that are arranged on the base layer and are electrically connected to a pair of first and second application electrodes, respectively, of the piezoelectric element, and an insulative cover layer. Each of the first and second conductor layers has an external-side terminal region and a piezoelectric element-side terminal region. The cover layer encloses the first and second conductor layers in a state where at least the external-side terminal region and the piezoelectric element-side terminal region are accessible.

In a preferable configuration, the base layer includes a plurality of piezoelectric-element overlapping portions that partially overlap with the plurality of piezoelectric elements, respectively, in the plan view, and a distal end portion that integrally supports the plurality of piezoelectric-element overlapping portions. The piezoelectric-element overlapping portion includes first and second tab regions respectively corresponding to the first and second application electrodes of the corresponding piezoelectric element, wherein each of the first and second tab regions ($112a$,$112b$) has a connection opening ($115a$,$115b$).

In this case, the piezoelectric element-side terminal region of the first conductor layer has a bridge shape that extends across the connection opening of the first tab region and is supported at a distal end side by the first tab region, and the piezoelectric element-side terminal region of the second conductor layer has a bridge shape that extends across the connection opening of the second tab region and is supported at a distal end side by the second tab region.

The piezoelectric element is configured so that the first and second application electrodes can be electrically connected from the upper side. The wiring assembly is fixed to a top surface of the lower sealing plate in a state where the connection opening of the first tab region overlaps with an electrical connectable portion of the first application electrode in the plan view and the connection opening of the second tab region overlaps with an electrical connectable portion of the second application electrode in the plan view. A portion of the piezoelectric element-side terminal region of the first conductor layer that extends across the connection opening of the first tab region is electrically connected to the electrical connectable portion of the first application electrode of the corresponding piezoelectric element, and a portion of the piezoelectric element-side terminal region of the second conductor layer that extends across the connection opening of the second tab region is electrically connected to the electrical connectable portion of the second application electrode of the corresponding piezoelectric element.

The cover layer may include a cover-side first tab region, a cover-side second tab region and a cover-side distal end portion that correspond to the first tab region, the second tab region and the distal end portion of the base layer, respectively.

The electrical connection between the piezoelectric element-side terminal region of the first conductor layer and the electrical connectable portion of the first application electrode of the corresponding piezoelectric element, and the electrical connection between the piezoelectric element-side terminal region of the second conductor layer and the electrical connectable portion of the second application electrode of the corresponding piezoelectric element may be realized by conductive adhesive, solder or ultrasonic bonding.

In a preferable configuration, sides of the plurality of piezoelectric elements in a space surrounded by the central opening of the lower sealing plate are filled with flexible resin.

The ultrasonic transducer according to any one of the above various configurations preferably may further include an upper sealing plate fixed to the top surfaces of the lower sealing plate and the wiring assembly via a flexible resin.

The upper sealing plate is provided with opening parts at positions corresponding to the plurality of piezoelectric elements.

The ultrasonic transducer may further include a sound absorbing material fixed to a top surface of the upper sealing plate so as to cover the plurality of opening parts of the upper sealing plate.

The ultrasonic transducer may further include a reinforcing plate fixed to a top surface of the sound absorbing material.

The ultrasonic transducer according to any one of the above various configurations preferably may further include a protective plate fixed to a bottom surface of the substrate. The protective plate is provided with a plurality of opening parts corresponding to the plurality of opening parts in the substrate.

In order to achieve the first object, a second aspect of the present invention provides an ultrasonic transducer including a rigid substrate that is provided with a plurality of opening parts penetrating the rigid substrate between a bottom surface and a top surface thereof; a flexible resin film that is fixed to the top surface of the substrate so as to cover the plurality of opening parts; a plurality of piezoelectric elements that are fixed to a top surface of the resin film so as to overlap with the plurality of opening parts, respectively, in a plan view; a lower sealing plate that includes a central opening with a size surrounding an opening part forming region in which the plurality of opening parts of the rigid substrate are formed, and that is fixed to the top surface of the flexible resin film so that the central opening surrounds the opening part forming region in the plan view; and a wiring assembly fixed to a top surface of the lower sealing plate.

In the ultrasonic transducer according to the second aspect, the piezoelectric element includes a piezoelectric element main body, an inner electrode that partitions the piezoelectric element main body into a first piezoelectric portion on an upper side and a second piezoelectric portion on a lower side in a thickness direction, a top surface electrode fixed to a part of a top surface of the first piezoelectric portion, a bottom surface electrode that is fixed to a bottom surface of the second piezoelectric portion and forms an outer electrode along with the top surface electrode, an inner electrode connection member of which one end part is electrically connected to the inner electrode and the other end part forms an inner electrode terminal accessible at the top surface of the first piezoelectric portion while being insulated from the top surface electrode, and a bottom surface electrode connection member of which one end part is electrically connected to the bottom surface electrode and the other end part forms a bottom surface electrode terminal accessible at the top surface of the first piezoelectric portion while being insulated from the top surface electrode and the inner electrode.

The ultrasonic transduce according to the second aspect of the present invention makes it possible to sufficiently secure vibrations and amplitudes of vibrating bodies in which the plurality of piezoelectric elements are respectively mounted even in a case where a frequency of a drive voltage applied to the piezoelectric elements is set to be lower than the resonance frequency of the vibrating body rather than a frequency in the vicinity of the resonance frequency of the vibrating body.

Therefore, the ultrasonic transduce makes it possible to precisely control the phases of the ultrasonic waves generated by the plurality of vibrating bodies without strictly matching the resonance frequencies of the plurality of vibration bodies.

The wiring assembly includes an insulating base layer, an outer electrode conductor layer and an inner electrode conductor layer arranged on the base layer, each of which has an external-side terminal region and a piezoelectric element-side terminal region, and a cover layer that encloses the outer electrode conductor layer and the inner electrode conductor layer in a state where at least the external-side terminal region and the piezoelectric element-side terminal region are accessible.

The base layer includes a plurality of piezoelectric-element overlapping portions that partially overlap with the plurality of piezoelectric elements, respectively, in a plan view, and a distal end portion that integrally supports the plurality of piezoelectric-element overlapping portions. The piezoelectric-element overlapping portion includes an outer electrode tab region having an outer electrode connection opening and an inner electrode tab region having an inner electrode connection opening.

The piezoelectric element-side terminal region of the outer electrode conductor layer has a bridge shape that extends across the outer electrode connection opening and is supported at a distal end side by the outer electrode tab region. The piezoelectric element-side terminal region of the inner electrode conductor layer has a bridge shape that extends across the inner electrode connection opening and is supported at a distal end side by the inner electrode tab region.

The wiring assembly is fixed to a top surface of the lower sealing plate in a state where the outer electrode connection opening overlaps, in the plan view, with a part of the top surface electrode and the bottom surface electrode terminal of the corresponding piezoelectric element and the inner electrode connection opening overlaps, in the plan view, with the inner electrode terminal of the corresponding the piezoelectric element. A portion of the piezoelectric element-side terminal region of the outer electrode conductor layer that extends across the outer electrode connection opening is electrically connected to the part of the top surface electrode and the bottom surface electrode terminal of the corresponding piezoelectric element. A portion of the piezoelectric element-side terminal region of the inner electrode conductor layer that extends across the inner electrode connection opening is electrically connected to the inner electrode terminal of the corresponding piezoelectric element.

The ultrasonic transducer according to the second aspect of the present invention makes it possible to sufficiently secure vibrations and amplitudes of vibrating bodies in which the plurality of piezoelectric elements are respectively mounted even in a case where a frequency of a drive voltage applied to the piezoelectric elements is set to be lower than the resonance frequency of the vibrating body rather than a frequency in the vicinity of the resonance frequency of the vibrating body.

Therefore, the ultrasonic transducer makes it possible to precisely control the phases of the ultrasonic waves generated by the plurality of vibrating bodies without strictly matching the resonance frequencies of the plurality of vibration bodies.

In a preferable configuration in the above various configurations of the second aspect, one of the outer electrode conductor layer and the inner electrode conductor layer includes a plurality of individual wirings that are independent from one another and are electrically connected to the corresponding electrodes of the plurality of piezoelectric elements, respectively, and the other one of the outer electrode conductor layer and the inner electrode conductor layer includes a single wiring connected to the corresponding electrodes of the plurality of piezoelectric elements.

In a more preferable configuration, the base layer includes, in addition to the distal end portion and the plurality of piezoelectric-element overlapping portions, a proximal end portion that supports the external-side terminal regions of the outer electrode conductor layer and the inner electrode conductor layer and an intermediate portion that couples the distal end portion and the proximal end portion.

Each of the wirings of the outer electrode conductor layer and the inner electrode conductor layer includes, in addition to the external-side terminal region and the piezoelectric element-side terminal region, a distal end region supported by the distal end portion and connected with a proximal side of the piezoelectric element-side terminal region, and an intermediate region supported by the intermediate portion and connecting the distal end region and the external-side terminal region.

In this case, the plurality of individual wirings in one of the outer electrode conductor layer and the inner electrode conductor layer are fixed to a reference surface, which is one of the bottom surface of the base layer facing the piezoelectric element and the top surface of the base layer on the far side from the piezoelectric element, over the entire area from the external-side terminal region to the piezoelectric element-side terminal region.

The single wiring in the other one of the outer electrode conductor layer and the inner electrode conductor layer is configured so that the external-side terminal region is fixed to the reference surface of the base layer, the intermediate region is fixed to a back surface opposite to the reference surface of the base layer, the distal end region and the piezoelectric element-side terminal region are fixed to the reference surface of the base layer, and the intermediate region is electrically connected to the external-side terminal region and the distal end region via through-holes formed in the base layer.

In order to achieve the second object, the present invention provides A manufacturing method of an ultrasonic transducer, including:

a rigid substrate forming step of forming a rigid substrate including a plurality of opening parts that penetrate the rigid substrate between a bottom surface and a top surface thereof by etching a rigid plate material;

a flexible resin film fixing step of fixing a flexible resin film to the top surface of the rigid substrate so as to cover the plurality of opening parts by an adhesive or by thermocompression bonding;

a piezoelectric body assembly forming step of preparing a plurality of two-layer laminated type piezoelectric elements each configured so that a top surface electrode, a bottom surface electrode terminal electrically connected to a bottom surface electrode that forms an outer electrode along with the top surface electrode and an inner electrode terminal electrically connected to an inner electrode are accessible from the upper side, and then fixing the plurality of piezoelectric elements to the top surface of the flexible resin film by an insulating adhesive so that the plurality of the piezoelectric elements overlap with the plurality of opening parts, respectively, in a plan view to form a piezoelectric body assembly;

a lower sealing plate arranging step of preparing a lower sealing plate that includes a central opening having a size surrounding an opening part forming region in which the plurality of opening parts of the rigid substrate are formed, and then fixing the lower sealing plate to the top surface of the flexible resin film by an adhesive so that the central opening surrounds the opening part forming region in the plan view, a wiring assembly preparation step of preparing a wiring assembly that includes an insulating base layer, an outer electrode conductor layer and an inner electrode conductor layer arranged on the base layer, each of which has an external-side terminal region and a piezoelectric element-side terminal region, and a cover layer that encloses the outer electrode conductor layer and the inner electrode conductor layer in a state where at least the external-side terminal region and the piezoelectric element-side terminal region are accessible, wherein the base layer includes a plurality of piezoelectric-element overlapping portions that partially overlap with the plurality of piezoelectric elements, respectively, in the plan view, and a distal end portion that integrally supports the plurality of piezoelectric-element overlapping portions, wherein the piezoelectric-element overlapping portion includes an outer electrode tab region having an outer electrode connection opening and an inner electrode tab region having an inner electrode connection opening, wherein the piezoelectric element-side terminal region of the outer electrode conductor layer has a bridge shape that extends across the outer electrode connection opening and is supported at a distal end side by the outer electrode tab region, wherein the piezoelectric element-side terminal region of the inner electrode conductor layer has a bridge shape that extends across the inner electrode connection opening and is supported at a distal end side by the inner electrode tab region;

a wiring assembly fixing step of fixing the wiring assembly to the top surface of the lower sealing plate by an insulating adhesive in a state where the outer electrode connection opening overlaps in a plan view with a part of the top surface electrode and the bottom surface electrode terminal of the corresponding piezoelectric element, and the inner electrode connection opening overlaps in a plan view with the inner electrode terminal of the corresponding piezoelectric element;

an electric connection step of electrically connecting a bridge portion of the piezoelectric element-side terminal region of the outer electrode conductor layer to both a part of the top surface electrode and the bottom surface electrode terminal of the corresponding piezoelectric element, and electrically connecting a bridge portion of the piezoelectric element-side terminal region of the inner electrode conductor layer to the inner electrode terminal of the corresponding piezoelectric element, wherein the wiring assembly preparation step is performed independently from the rigid substrate forming step, the flexible resin film fixing step, the piezoelectric body assembly forming step and the lower sealing plate arranging step, at least before the wiring assembly fixing step.

The manufacturing method according to the present invention makes it possible to efficiently manufacture an ultrasonic transduce capable of sufficiently securing vibrations and amplitudes of vibrating bodies in which the plurality of piezoelectric elements are respectively mounted even in a case where a frequency of a drive voltage applied to the piezoelectric elements is set to be lower than the resonance frequency of the vibrating body rather than a frequency in the vicinity of the resonance frequency of the vibrating body so that the ultrasonic transduce makes it possible to precisely control the phases of the ultrasonic waves generated by the plurality of vibrating bodies can be precisely controlled without strictly matching the resonance frequencies of the plurality of vibration bodies.

The manufacturing method may include a joining step in which the wiring assembly fixing step and the electric connection step are collectively performed at the same time.

The joining step includes a process of applying a thermosetting insulating adhesive to a portion of the top surface of the lower sealing plate where the wiring assembly is located; a process of applying a thermosetting conductive adhesive so as to extend across the part of the top surface electrode and the bottom surface electrode terminal of the piezoelectric element; a process of applying a thermosetting conductive adhesive to the inner electrode terminal of the piezoelectric element; a process of forming a preassembly by arranging the wiring assembly at a predetermined position on the top surface of the lower sealing plate; and a process of curing the thermosetting insulating adhesive and the thermosetting conductive adhesive by heating and treating the preassembly.

In the manufacturing method, the electric connection step may include a process of electrically connecting a bridge portion of the piezoelectric element-side terminal region of the outer electrode conductor layer to both the part of the top surface electrode and the bottom surface electrode terminal of the piezoelectric element by solder or ultrasonic bonding; and a process of electrically connecting a bridge portion of the piezoelectric element-side terminal region of the inner electrode conductor layer to the inner electrode terminal of the piezoelectric element by solder or ultrasonic bonding.

The manufacturing method according to the present invention preferably may further include a sealing resin arranging step of providing a thermosetting sealing resin into side portions of the plurality of piezoelectric elements in a space defined by the central opening of the lower sealing plate, and curing the thermosetting sealing resin by heating, after the lower sealing plate arranging step and before the wiring assembly fixing step.

The manufacturing method according to the present invention preferably may further include a protective plate fixing step performed at any timing after the piezoelectric body assembly forming step.

The protective plate fixing step is configured to prepare a rigid protective plate including a plurality of protective-plate opening parts corresponding to the plurality of opening parts in the rigid substrate, and fix the protective plate to the bottom surface of the rigid substrate by an adhesive.

The manufacturing method according to the present invention preferably may further include an upper sealing plate arranging step performed after the electric connection step.

The upper sealing plate arranging step includes a process of applying a thermosetting type flexible resin to the top surface of the wiring assembly; a process of arranging a rigid upper sealing plate on the flexible resin, the upper sealing plate including opening parts at positions corresponding to the plurality of piezoelectric elements; and a process of curing the flexible resin by heating.

The manufacturing method according to the present invention preferably may further include a sound absorbing material arranging step and a reinforcing plate arranging step performed after the upper sealing plate arranging step.

The sound absorbing material arranging step includes a process of applying a thermosetting insulating adhesive to the top surface of the upper sealing plate; a process of arranging a sound absorbing material on the thermosetting insulating adhesive; and a process of curing the thermosetting insulating adhesive by heating.

The reinforcing plate arranging step includes a process of applying a thermosetting insulating adhesive to the top surface of the sound absorbing material, a process of arranging a rigid reinforcing plate on the thermosetting insulating adhesive and a process of curing the thermosetting insulating adhesive by heating.

BRIEF DESCRIPTION OF THE DRAWINGS

FIG. 14 is a plan view of a part of a preassembly in which the wiring assembly is fixed to the piezoelectric body assembly, and corresponds to a state viewed along line XIV-XIV in FIG. 2.

EMBODIMENT FOR CARRYING OUT THE INVENTION

An embodiment of an ultrasonic transducer according to the present invention will be described below with reference to the accompanying drawings.

Figure 1:
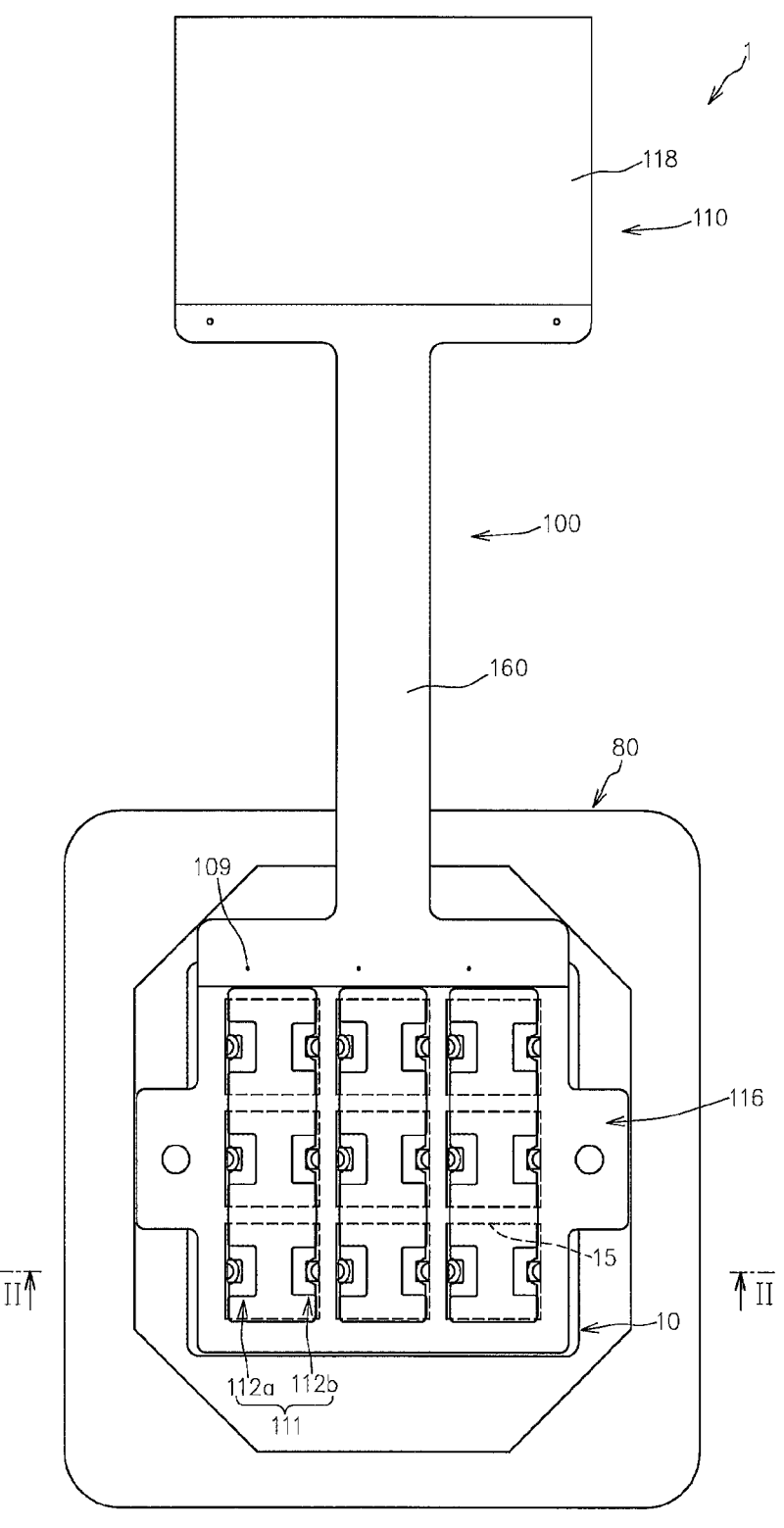
FIG. 1 is a plan view of an ultrasonic transducer according to one embodiment of the present invention.

FIG. 1 illustrates a plan view of an ultrasonic transducer 1 according to the present embodiment.

It is noted that, in FIG. 1, some components are omitted to facilitate understanding.

Figure 2:
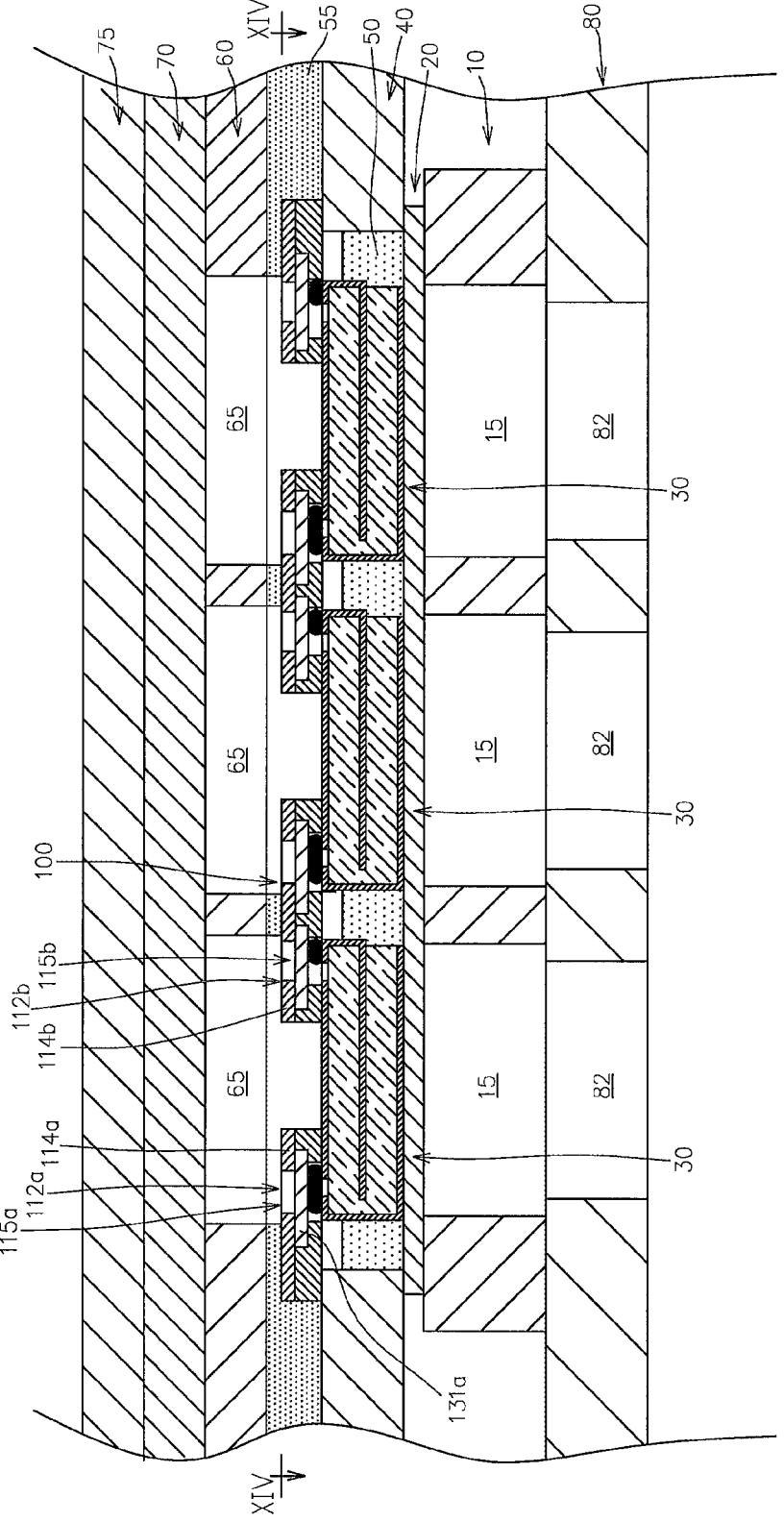
FIG. 2 is a part of a vertically sectional front view of the ultrasonic transducer along line II-II in FIG. 1.

Further, FIG. 2 illustrates a part of a vertically sectional front view of the ultrasonic transducer 1 along line II-II in FIG. 1.

Moreover, FIGS. 3 to 5 illustrate plan views of each component of the ultrasonic transducer 1.

Figures 3A, 3B, 3C, 3D, 3E:
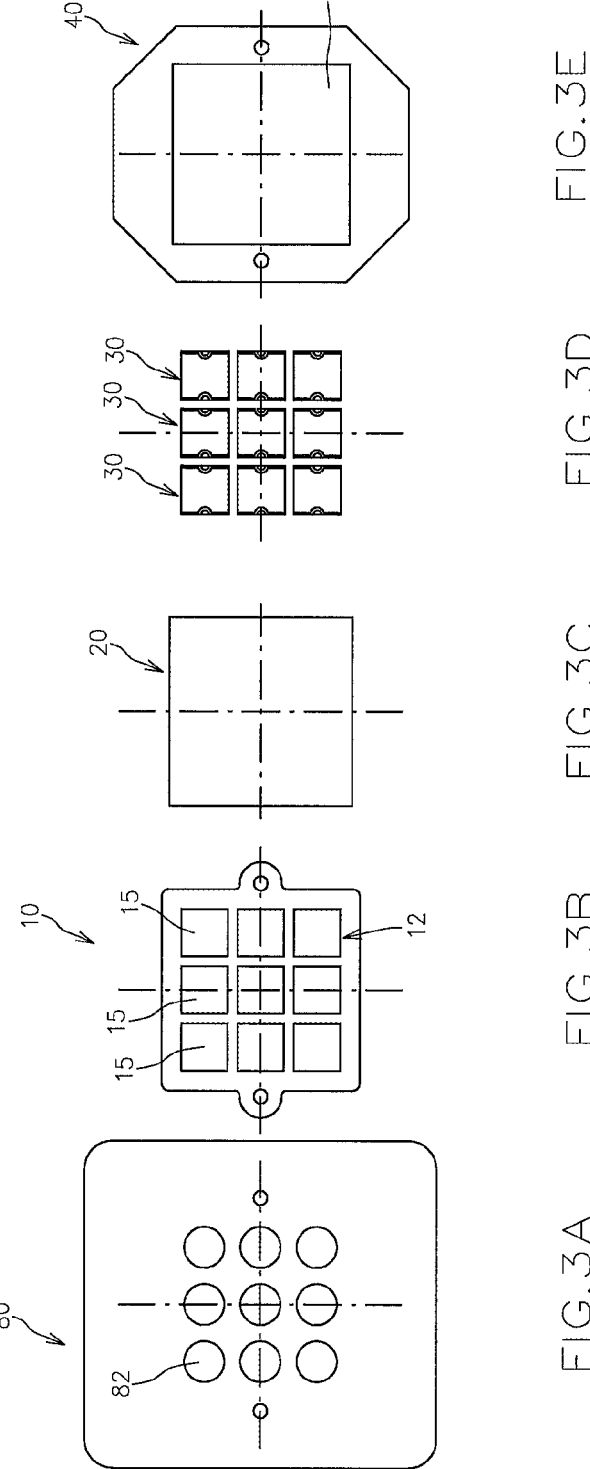
FIGS. 3A to 3E are plan views of a protective plate, a rigid substrate, a flexible resin film, a plurality of piezoelectric elements and a lower sealing plate, respectively, that are components of the ultrasonic transducer, and the components shown in FIGS. 3A to 3E are laminated in this order from the lower side to the upper side on the basis of the state shown in FIG. 2.
Figures 4A, 4B, 4C, 4D, 4E:
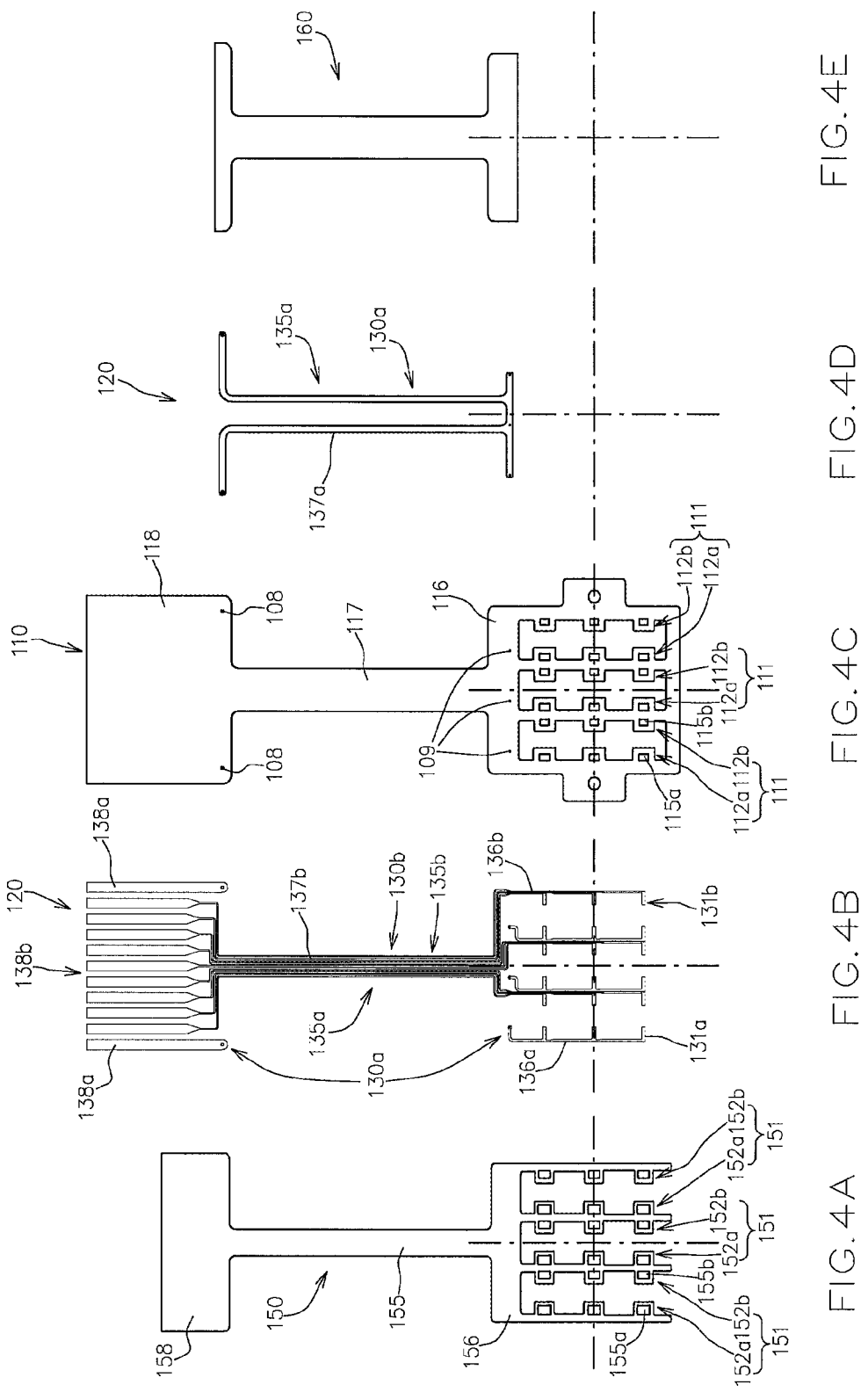
FIGS. 4A to 4E are plan views of a cover layer, a conductor layer, a base layer, an intermediate region of an outer electrode conductor layer in the conductor layer and a back-surface-side cover layer, respectively, that are components of the ultrasonic transducer, and the components shown in FIGS. 4A to 4E are laminated in this order from the lower side to the upper side on the basis of the state shown in FIG. 2.
Figures 5A, 5B, 5C:
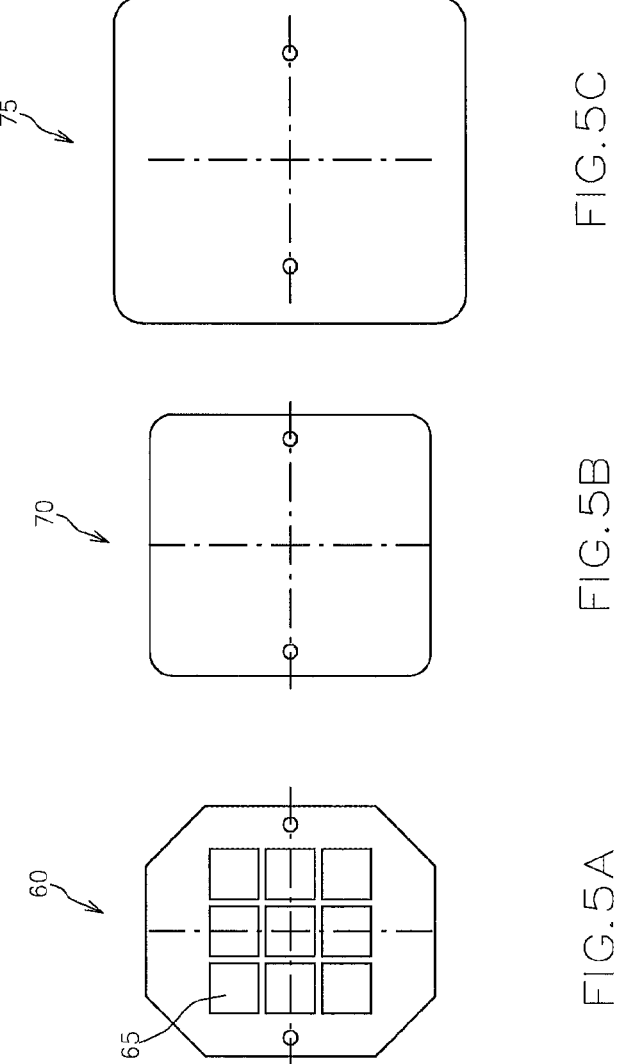
FIGS. 5A to 5C are plan views of an upper sealing plate, a conductor layer, a sound absorbing material and a reinforcing plate, respectively, that are components of the ultrasonic transducer, and the components shown in FIGS. 5A to 5C are laminated in this order from the lower side to the upper side on the basis of the state shown in FIG. 2.

In the ultrasonic transducer 1, a protective plate 80 illustrated in FIG. 3A, a rigid substrate 10 illustrated in FIG. 3B, a flexible resin film 20 illustrated in FIG. 3C, a plurality of piezoelectric elements 30 illustrated in FIG. 3D, a lower sealing plate 40 illustrated in FIG. 3E, a cover layer 150 illustrated in FIG. 4A, a conductor layer 120 illustrated in FIG. 4B, a base layer 110 illustrated in FIG. 4C, an intermediate region 137a illustrated in FIG. 4D, which is a part of an outer electrode conductor layer 130a in the conductor layer 120, a back-surface-side cover layer 160 illustrated in FIG. 4E, an upper sealing plate 60 illustrated in FIG. 5A, a sound absorbing material 70 illustrated in FIG. 5B, and a reinforcing plate 75 illustrated in FIG. 5C are sequentially arranged from bottom to top using the cross-sectional view in FIG. 2 as reference, which will be described in detail later.

It is noted that, in FIGS. 3A to 3E, FIGS. 4A to 4E, and FIGS. 5A to 5C, a center line is illustrated at the same position in a plan view to facilitate understanding of a relative positional relationship of each component.

As illustrated in FIGS. 1 to 5, the ultrasonic transducer 1 includes, as main components, the rigid substrate 10 provided with a plurality of opening parts 15 penetrating the rigid substrate 10 between a bottom surface and a top surface thereof (see FIG. 3B), the flexible resin film 20 fixed to the top surface of the substrate 10 to cover the plurality of opening parts 15, and the plurality of the piezoelectric elements 30 fixed to a top surface of the resin film 20 to overlap with the plurality of opening parts 15, respectively, in a plan view.

Figures 6A, 6B:
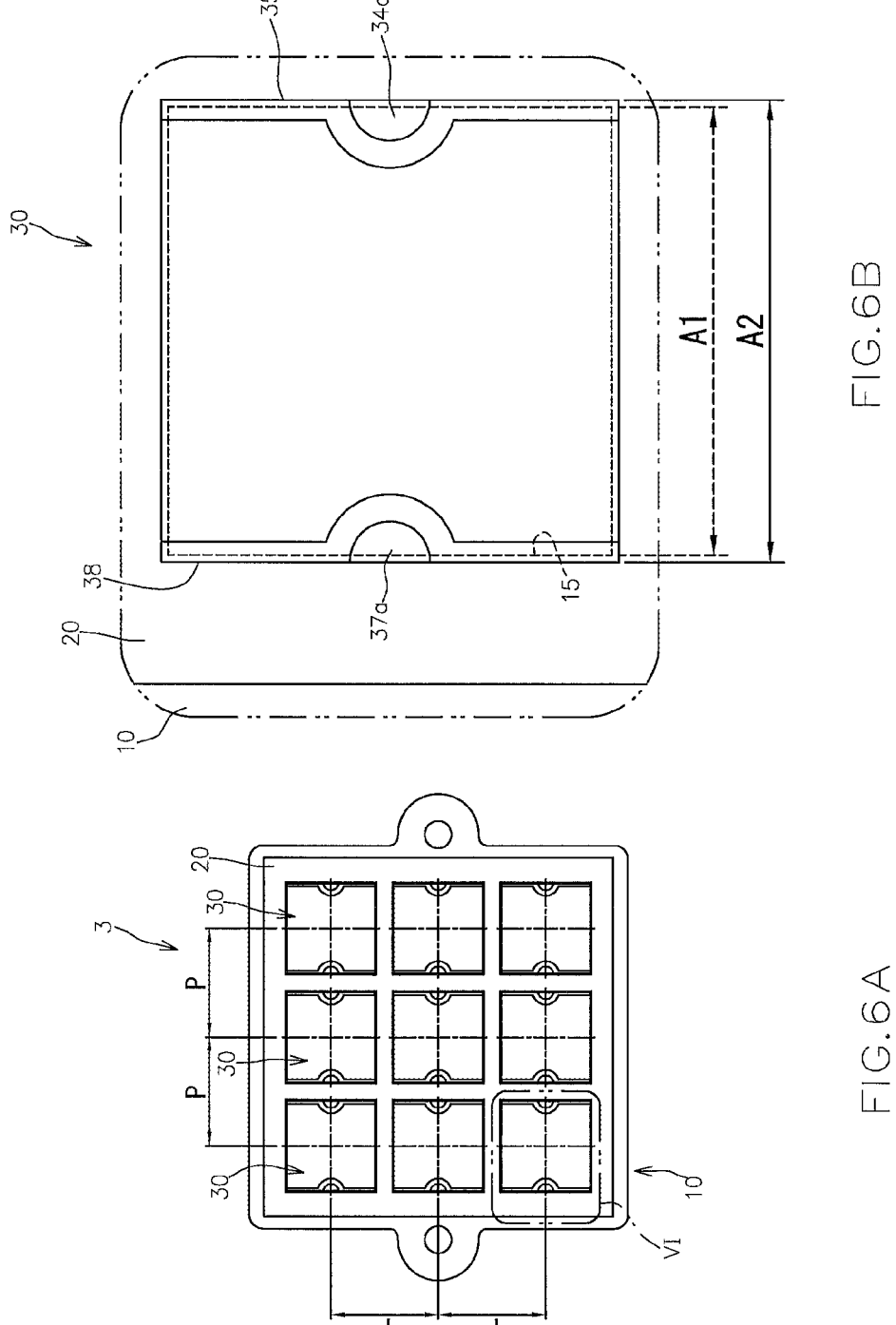
FIG. 6A a plan view of a piezoelectric body assembly in which the rigid substrate, the flexible resin film and the plurality of piezoelectric elements, which are main components of the ultrasonic transducer, are assembled.
FIG. 6B is an enlarged view of a part VI in FIG. 6A.

FIG. 6A illustrates a plan view of a piezoelectric body assembly 3 in which the rigid substrate 10, the flexible resin film 20, and the plurality of piezoelectric elements 30, which are main components of the ultrasonic transducer 1, are assembled.

Further, FIG. 6B illustrates an enlarged view of a part VI in FIG. 6A.

The manufacturing method according to the present invention makes it possible to efficiently manufacture an ultrasonic transducer capable of sufficiently securing vibrations and amplitudes of vibrating bodies in which the plurality of piezoelectric elements are respectively mounted even in a case where a frequency of a drive voltage applied to the piezoelectric elements is set to be lower than the resonance frequency of the vibrating body rather than a frequency in the vicinity of the resonance frequency of the vibrating body so that the ultrasonic transducer makes it possible to precisely control the phases of the ultrasonic waves generated by the plurality of vibrating bodies can be precisely controlled without strictly matching the resonance frequencies of the plurality of vibration bodies.

For example, the rigid substrate 10 is formed of a metal substrate such as stainless steel having a thickness of 0.1 mm to 0.4 mm, carbon fiber reinforced plastic, ceramics, and the like.

The flexible resin film 20 is formed of an insulating resin such as polyimide having a thickness of 20 μm to 100 μm, for example.

The flexible resin film 20 is fixed to the rigid substrate 10 by various methods such as an adhesive or thermocompression bonding.

Figures 7A, 7B:
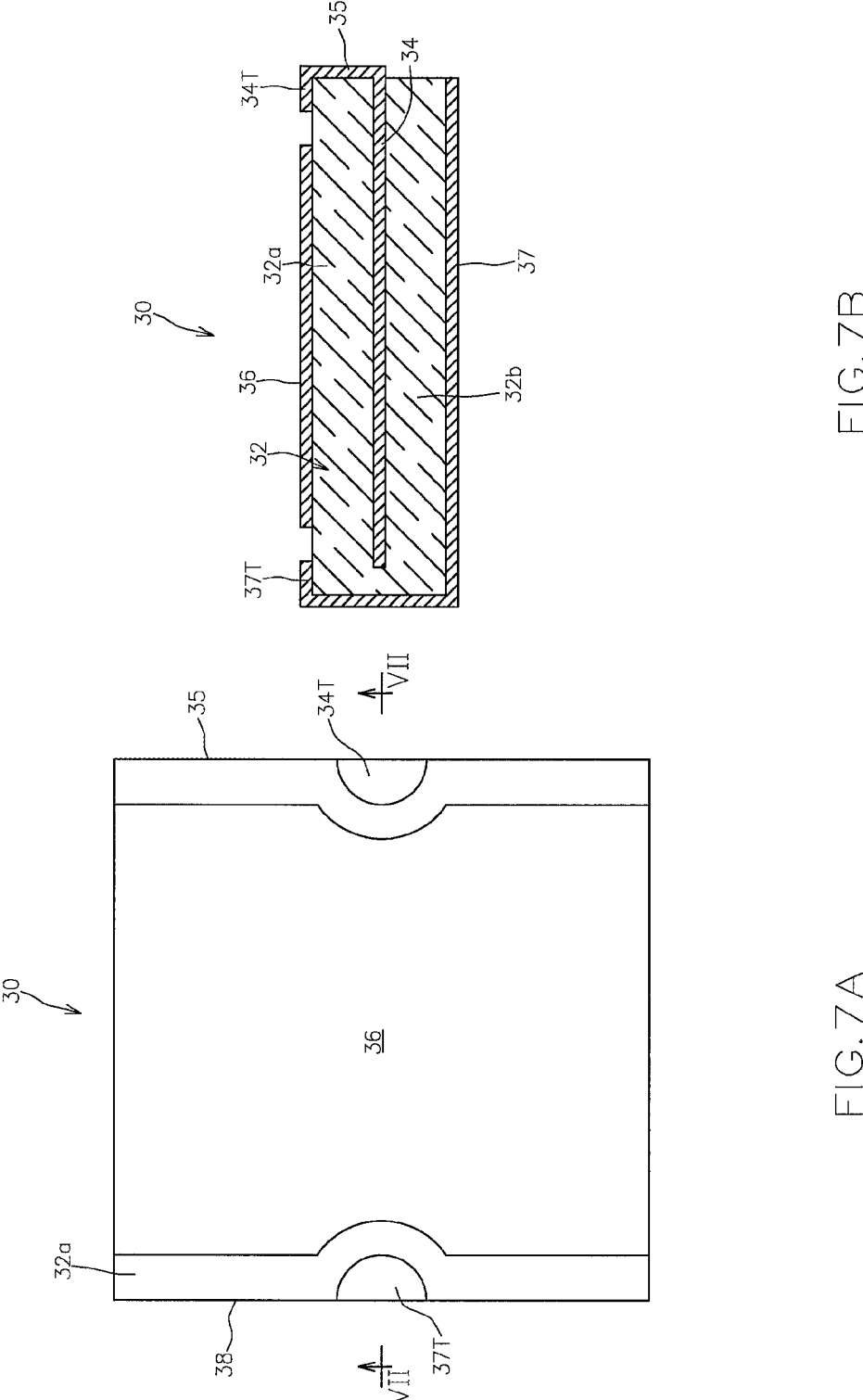
FIG. 7A is a plan view of the piezoelectric element.
FIG. 7B is a cross-sectional view along line VII-VII in FIG. 7A.

FIG. 7A illustrates a plan view of the piezoelectric element 30.

Further, FIG. 7B illustrates a cross-sectional view along line VII-VII in FIG. 7A.

The piezoelectric element 30 includes a piezoelectric element main body 32 and a pair of first and second application electrodes, and is configured to expand and contract when a voltage is applied between the first and second application electrodes.

The piezoelectric element 30 is preferably a laminated type piezoelectric element.

With the laminated type piezoelectric element, it is possible to increase the electric field strength when the same voltage is applied and increase the expansion/contraction displacement per applied voltage as compared with a single-layer type piezoelectric element.

As illustrated in FIG. 7B, in the present embodiment, the piezoelectric element 30 is a two-layer laminated type piezoelectric element.

Specifically, the piezoelectric element 30 includes the piezoelectric element main body 32 formed of a piezoelectric material such as lead zirconate titanate (PZT), an inner electrode 34 that partitions the piezoelectric element main body 32 into a first piezoelectric portion 32a on an upper side and a second piezoelectric portion 32b on a lower side in a thickness direction, a top surface electrode 36 fixed to a part of a top surface of the first piezoelectric portion 32a, a bottom surface electrode 37 fixed to a bottom surface of the second piezoelectric portion 32b, an inner electrode connection member 35 of which one end part is electrically connected to the inner electrode 34 and the other end part forms an inner electrode terminal 34T accessible at the top surface of the first piezoelectric portion 32a while being insulated from the top surface electrode 36, and a bottom surface electrode connection member 38 of which one end part is electrically connected to the bottom surface electrode 37 and the other end part forms a bottom surface electrode terminal 37T accessible at the top surface of the first piezoelectric portion 32a while being insulated from the top surface electrode 36 and the inner electrode 34.

In this case, an outer electrode formed by the top surface electrode 36 and the bottom surface electrode 37 acts as the first application electrode, and the inner electrode 34 acts as the second application electrode.

In the piezoelectric element 30, the first and second piezoelectric portions 32a and 32b have the same polarization direction in the thickness direction, and thus, when a predetermined voltage is applied between the outer electrode and the inner electrode 34 at a predetermined frequency, electric fields in opposite directions are applied to the first and second piezoelectric portions 32a and 32b.

As described above, the top surface electrode 36 and the bottom surface electrode 37 are insulated from each other.

Therefore, when the piezoelectric element 30 is formed, it is possible to apply a voltage between the top surface electrode 36 and the bottom surface electrode 37 so that the polarization directions of the first and second piezoelectric portions 32a and 32b may be the same.

The ultrasonic transducer 1 provided with the configuration of the piezoelectric body assembly 3 achieves the following effects.

That is, to detect an object several meters ahead by a phased array in which a plurality of piezoelectric elements forming vibrating bodies are arranged in parallel, as in the ultrasonic transducer 1 according to the present embodiment, it is necessary to precisely control phases of ultrasonic waves emitted from the plurality of vibrating bodies respectively mounted with the plurality of piezoelectric elements 30.

Here, in a conventional phased array in which a plurality of piezoelectric elements are arranged in parallel directly on a rigid substrate such as stainless steel, it is necessary to expand and contract the piezoelectric element against the rigidity of the rigid substrate so that the vibrating bodies make flexural vibrations with a predetermined amplitude, to secure a level of generated sound pressure.

For this purpose, it is necessary to set a frequency (drive frequency) of the voltage applied to the piezoelectric elements to a frequency in the vicinity of a resonance frequency of the vibrating body in which the piezoelectric element is mounted.

However, in the vibrating body on which the piezoelectric element is mounted, a phase of a frequency response of a vibrating operation of the vibrating body with respect to the voltage applied to the piezoelectric element changes largely in the vicinity of the resonance frequency of the vibrating body.

Therefore, to precisely control the phases of the ultrasonic waves generated by the plurality of piezoelectric elements with the aim of achieving the function of a phased array sensor, it is necessary to suppress as much as possible "variation" in the resonance frequency among the plurality of vibrating bodies, which is very difficult.

Thus, the ultrasonic transducer 1 according to the present embodiment includes, as described above, the rigid substrate 10 provided with the plurality of opening parts 15, the flexible resin film 20 fixed to the top surface of the substrate 10 to cover the plurality of opening parts 15, and the plurality of the piezoelectric elements 30 fixed to the top surface of the resin film 20 to overlap with the plurality of opening portions 15, respectively, in a plan view.

According to such a configuration, even if a resonance frequency of a flexural vibration of the vibrating body in which the piezoelectric element 30 is mounted is not set to a frequency in the vicinity of the frequency of a drive voltage applied to the piezoelectric elements 30 and the resonance frequency of the vibrating body is set to be higher than the frequency of the drive voltage, it is possible to sufficiently secure a vibration and an amplitude of the vibrating body.

Moreover, when the resonance frequencies of the plurality of vibrating bodies are higher than the frequency of the voltage applied to the piezoelectric elements 30, even if there is a "variation" in the resonance frequencies of the plurality of vibrating bodies, there is no great difference in the phases of the frequency response of the flexural vibration of the plurality of vibrating bodies.

Therefore, the phases of the ultrasonic waves generated by the plurality of vibrating bodies can be precisely controlled.

Relating to this effect, results of an analysis performed by using the finite element method (FEM) will be described below.

Figures 8A, 8B, 8C:
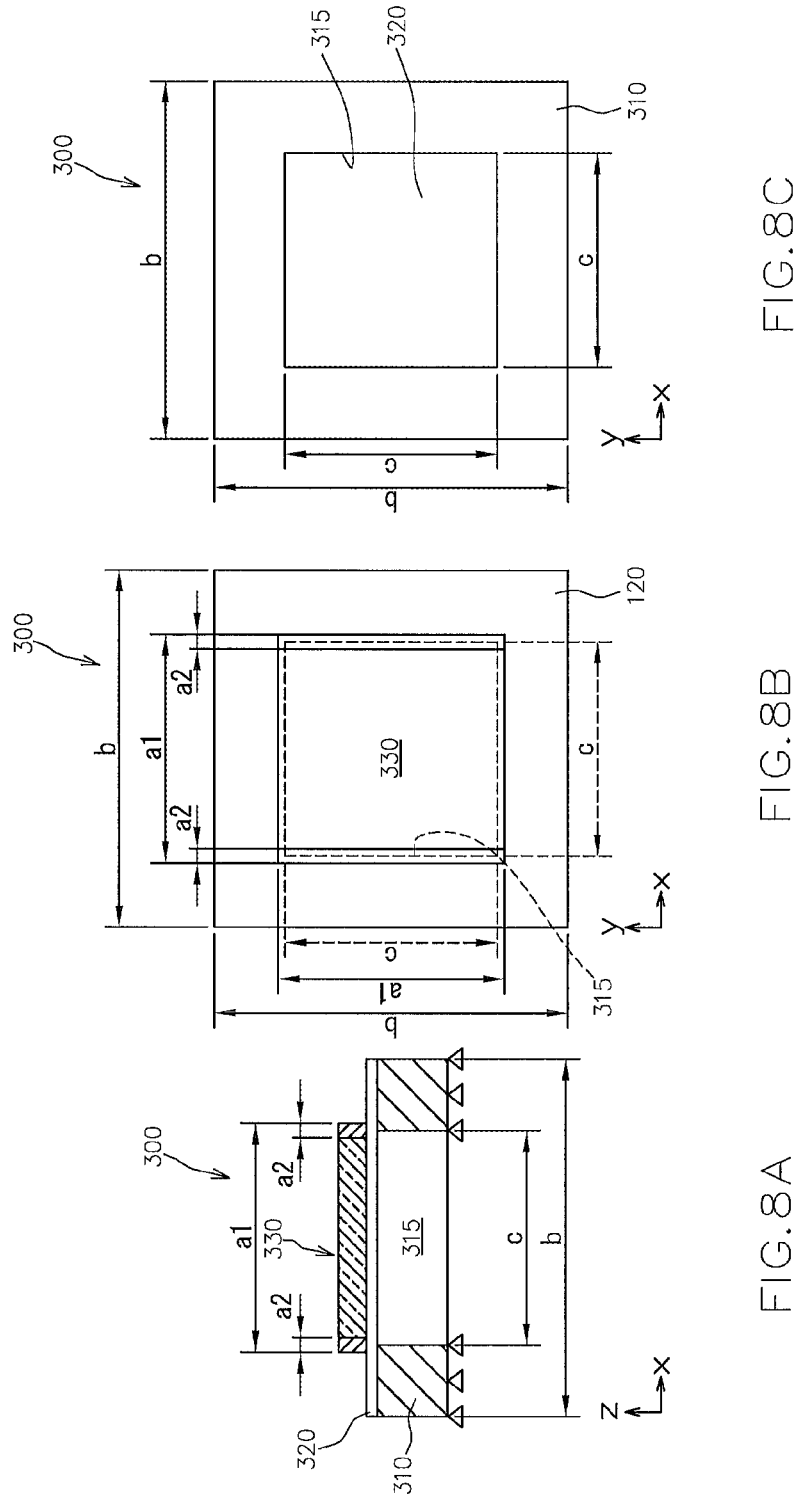
FIGS. 8A to 8C are a vertical sectional view, a plan view and a bottom view, respectively, of a model used in an analysis performed on the piezoelectric body assembly of the ultrasonic transduce according to the embodiment.

FIGS. 8A to 8C illustrate a vertically sectional view, a plan view, and a bottom view of a model 300 used in this analysis.

FIGS. 8A to 8C are a vertical sectional view, a plan view and a bottom view, respectively, of a model used in an analysis performed on the piezoelectric body assembly of the ultrasonic transducer according to the embodiment.

As described above, to detect an object several meters ahead by using the ultrasonic transducer 1 as a phased array sensor, it is necessary to set the frequency of the ultrasonic waves emitted by the vibrating bodies in which the piezoelectric elements 30 are mounted to a low frequency of about 40 kHz.

When the resonance frequency of the vibrating bodies is set to a resonance frequency (for example, 70 kHz) sufficiently higher than the frequency (40 kHz) of the voltage applied to the piezoelectric elements 30, the sound pressure of the ultrasonic waves generated by the vibrating bodies can be increased by increasing the longitudinal and lateral dimensions of the piezoelectric elements 30 in a plan view.

However, on the other hand, in a case where the plurality of piezoelectric elements 30 are arranged in parallel, as in the ultrasonic transducer 1 according to the present embodiment, to suppress the generation of grating lobes in the ultrasonic waves emitted from the plurality of vibrating bodies in which the plurality of piezoelectric elements 30 are respectively mounted, it is necessary that an arrangement pitch of the plurality of piezoelectric elements 30 is equal to or less than half of a wavelength λ of the ultrasonic waves emitted from the piezoelectric elements 30.

Figure 12:
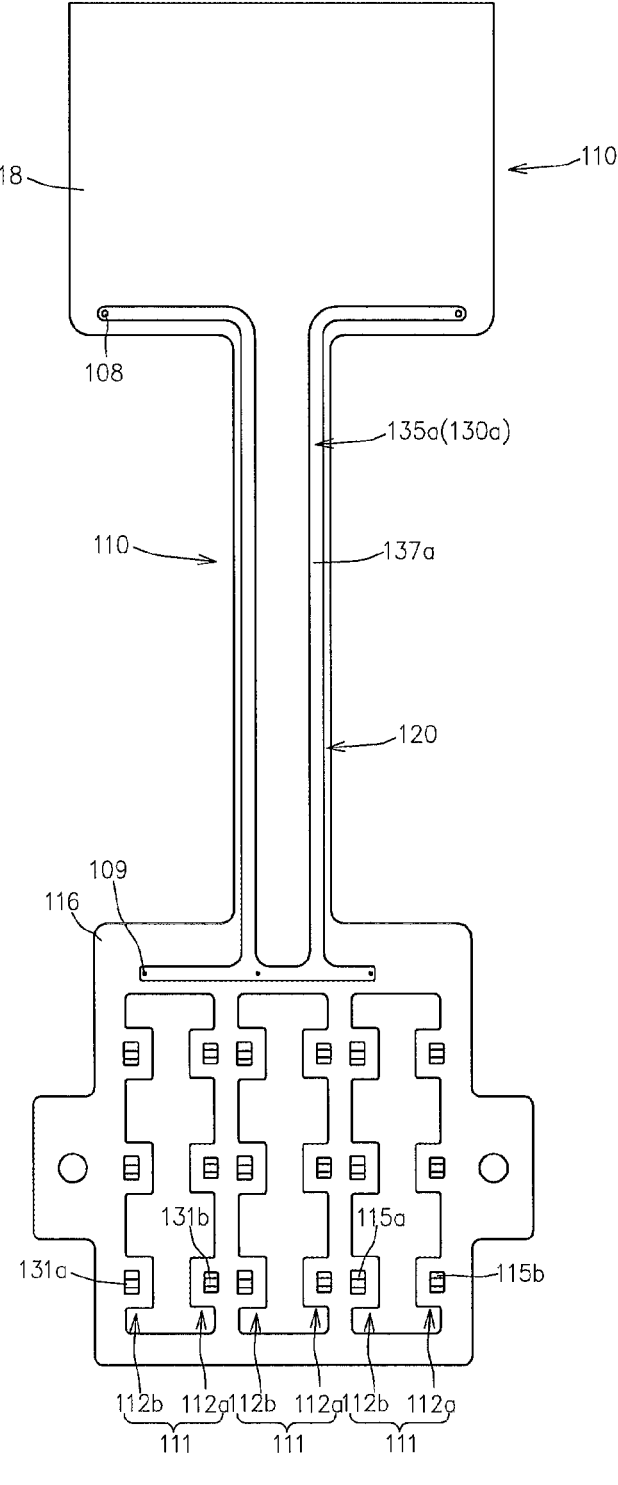
FIG. 12 is a plan view of a wiring assembly of the ultrasonic transduce according to the embodiment in a state that parts of the components of the wiring assembly are not shown.

FIG. 12 is a plan view of a wiring assembly of the ultrasonic transducer according to the embodiment in a state that parts of the components of the wiring assembly are not shown.

Therefore, it is preferable that the longitudinal and lateral dimensions of the piezoelectric elements 30 in a plan view are 3.0 mm or more from the viewpoint of ensuring sound pressure, and 4.0 mm or less from the viewpoint of suppressing the generation of grating lobes.

Based on this point, the model 300 used in this analysis has a square shape in a plan view having a side length a1 of 3.4 mm.

It is noted that, instead of the above-described shape, the piezoelectric elements 30 may of course also have a rectangular shape in a plan view including a straight rectangular shape having longitudinal and lateral dimensions in a plan view with a maximum value of 4.0 mm or less, a circular shape in a plan view having a diameter of 4.0 mm or less, or an elliptical shape in a plan view having a major axis of 4.0 mm or less.

(1) Analysis for Positional Displacement of Piezoelectric Element 330 (Hereinafter, Referred to as Analysis 1)

In a state where an opening width c of the opening part 315 was 3.3 mm and the thickness of the flexible resin film 320 was 0.05 mm, the resonance frequency of a vibrating body including the piezoelectric element 330 and the sound pressure (SPL) generated when a voltage having a frequency of 40 kHz was applied to the piezoelectric element 330 were calculated by using a finite element method analysis for a case where a displacement amount of the piezoelectric element 330 in one direction in a plan view (y-direction in FIG. 8) was zero (model 1-1), a case where the displacement amount was 0.05 mm (model 1-2), and a case where the displacement amount was 0.1 mm (model 1-3).

Figure 9:
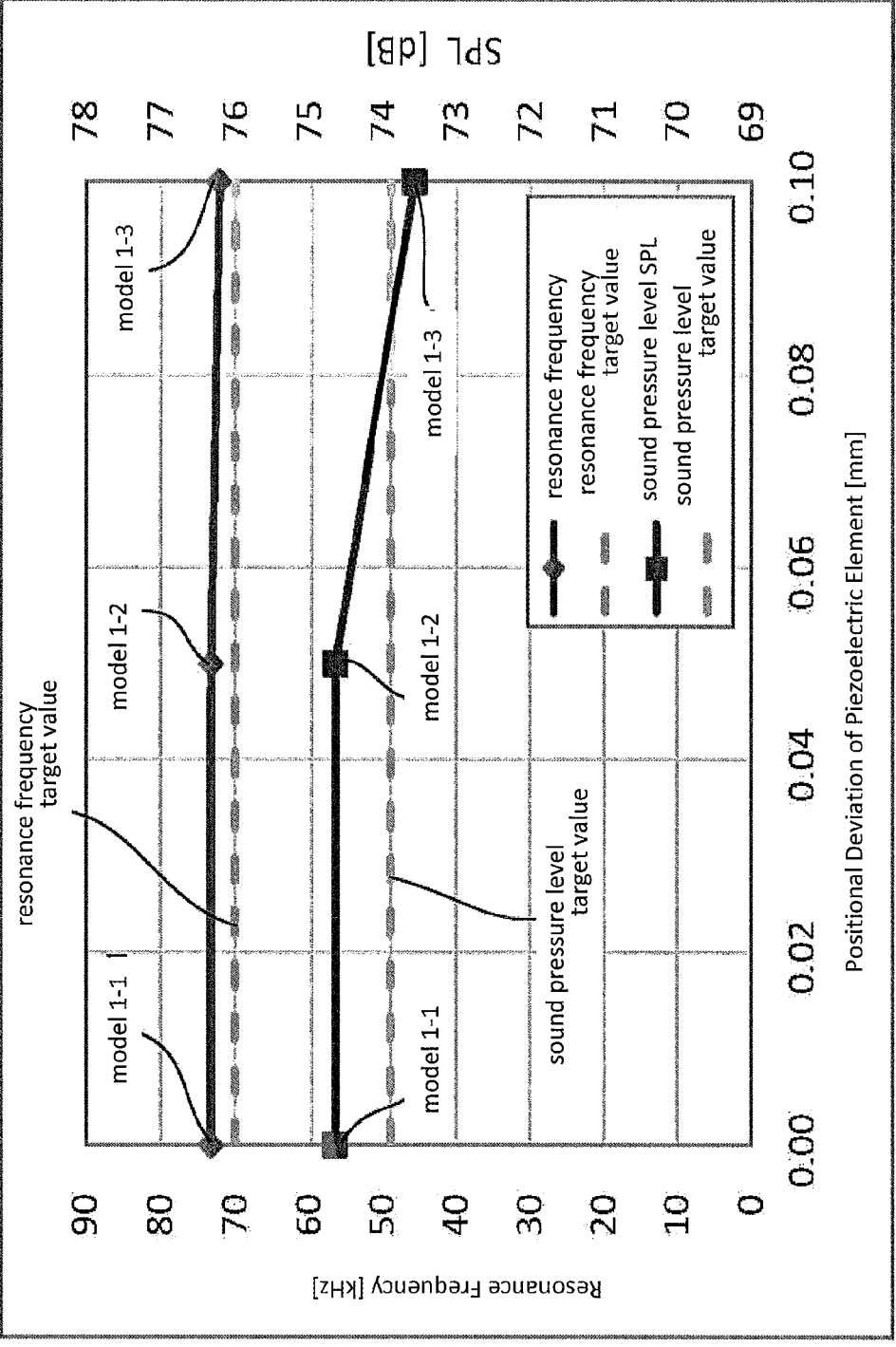
FIG. 9 is a graph showing a result of an analysis regarding positional displacement of the piezoelectric element with using the model shown in FIG. 8.

The calculation results are shown in FIG. 9.

In model 1-1, the displacement amount of the piezoelectric element 330 to one side in the y-direction is zero, which means that each of a side of the piezoelectric element 330 on the one side in the y-direction and a side of the piezoelectric element 330 on the other side in the y-direction overlap with the rigid substrate 310 in a width of 0.05 mm.

In model 1-2, the displacement amount of the piezoelectric element 330 to one side in the y-direction is 0.05 mm, which means that a side of the piezoelectric element 330 on the one side in the y-direction overlaps with the rigid substrate 310 in a width of 0.1 mm, but a side of the piezoelectric element 330 on the other side in the y-direction is along an edge of the opening part 315.

In model 1-3, the displacement amount of the piezoelectric element 330 to one side in the y-direction is 0.1 mm, which means that a side of the piezoelectric element 330 on the one side in the y-direction overlaps with the rigid substrate 310 in a width of 0.15 mm, but a side of the piezoelectric element 330 on the other side in the y-direction is away from the edge of the opening part 315 via a gap having a width of 0.05 mm.

From the results of Analysis 1, it is considered preferable to arrange the piezoelectric element 330 so that the entire circumference of the piezoelectric element 330 overlaps with the rigid substrate 310 in a plan view.

(2) Analysis for Size of Opening Width c of Opening Part 315 (Hereinafter, Referred to as Analysis 2)

In a state where the thickness of the flexible resin film 320 was 0.05 mm, the resonance frequency of the vibrating body including the piezoelectric element 330 and the sound pressure (SPL) generated when a voltage having a frequency of 40 kHz was applied to the piezoelectric element 330 were calculated by using a finite element method analysis for a case where the opening width c of the opening part 315 was 3.2 mm (model 2-1), a case where the opening width c was 3.3 mm (model 2-2), and a case where the opening width c was 3.4 mm (model 3-3).

Figure 10:
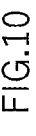
FIG. 10 is a graph showing a result of a size of opening width of a opening part formed in a rigid substrate with using the model shown in FIG. 8.

The calculation results are shown in FIG. 10.

Model 2-1 refers to a state where a peripheral edge of the piezoelectric element 330 overlaps with the rigid substrate 310 in a width of 0.1 mm over the entire circumference.

Model 2-2 refers to a state where the peripheral edge of the piezoelectric element 330 overlaps with the rigid substrate 310 in a width of 0.05 mm over the entire circumference.

Model 2-3 refers to a state where the peripheral edge of the piezoelectric element 330 is along the edge of the opening part 315 over the entire circumference.

In the results of Analysis 2, when the overlapping width between the piezoelectric element 330 and the rigid substrate 310 is 0.1 mm (model 2-1), the sound pressure level is too low, when the overlapping width is zero (model 2-3), the resonance frequency does not reach a target value, but when the overlapping width is 0.05 mm (model 2-2), both the resonance frequency and the sound pressure level are in balance.

From the results of Analysis 1 and 2, it is considered preferable that the piezoelectric element 330 overlaps with the rigid substrate 310 over the entire circumference, and the overlapping width is 0.05 mm.

Further, when the piezoelectric element 330 is mounted to the flexible resin film 320 by an adhesive, it is considered that a maximum positional deviation of 0.03 mm may occur as a manufacturing error.

Based on this, it is preferable to choose a design in which the entire circumference of the piezoelectric element 330 overlaps with the rigid substrate 310 in an overlapping width of 0.03 mm to 0.07 mm.

(3) Analysis for Thickness of Flexible Resin Film 320 (Hereinafter, Referred to as Analysis 3)

In a state where the opening width c of the opening part 315 was 3.3 mm, the resonance frequency of the vibrating body including the piezoelectric element 330 and the sound pressure (SPL) generated when a voltage having a frequency of 40 kHz was applied to the piezoelectric element 330 were calculated by using a finite element method analysis for a case where the thickness of the flexible resin film 320 was 0.013 mm (model 3-1), a case where the thickness was 0.025 mm (model 3-2), a case where the thickness was 0.05 mm (model 3-3), and a case where the thickness was 0.075 mm (model 3-4).

Figure 11:
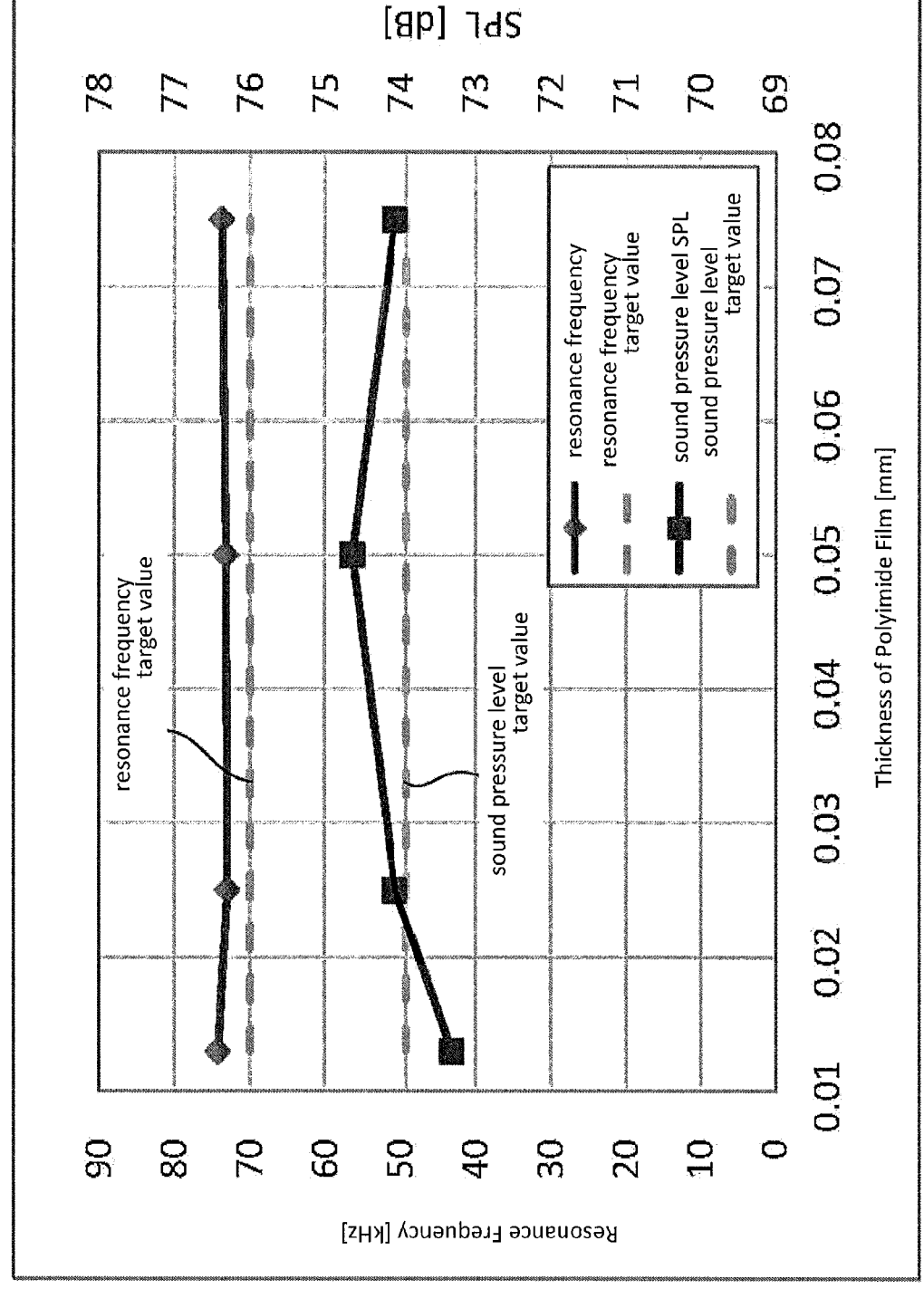
FIG. 11 is a graph showing a result of an analysis regarding thickness of a flexible resin file with using the model shown in FIG. 8

The calculation results are shown in FIG. 11.

From the results of Analysis 3, when a polyimide film is used as the flexible resin film 320, it is considered preferable that the film thickness is 0.025 mm or more and 0.075 mm or less.

This is because, it is considered that, if the film thickness is too thin (less than 0.025 mm), an influence from the rigidity of the rigid substrate 310 on a peripheral edge part of the piezoelectric element 330 is too strong and the vibration and amplitude of the piezoelectric element 330 decreases, and on the other hand, if the film thickness is too thick (if the film thickness exceeds 0.075 mm), the rigidity of the polyimide film is too strong, and the vibration and amplitude of the piezoelectric element 330 decrease.

As illustrated in FIGS. 1 to 4, the ultrasonic transducer 1 according to the present embodiment includes the lower sealing plate 40 and a wiring assembly 100, in addition to the piezoelectric body assembly 3.

The lower sealing plate 40 includes a central opening 42 having a size surrounding an opening part forming region 12 (see FIG. 3B) in which the plurality of opening parts 15 of the rigid substrate 10 are formed, and the lower sealing plate 40 is fixed to the top surface of the flexible resin film 20 so that the central opening 42 surrounds the plurality of opening parts 15 in a plan view.

As illustrated in FIG. 2, the lower sealing plate 40 has substantially the same thickness as the piezoelectric element 30, and is fixed to the top surface of the flexible resin film 20 by an adhesive, thermocompression bonding, or the like.

The lower sealing plate 40 is preferably formed of a metal such as stainless steel, carbon fiber reinforced plastic, ceramics, or the like.

The lower sealing plate 40 seals sides of a piezoelectric element group including the plurality of piezoelectric elements 30, and also acts as a mounting base to which the wiring assembly 100 is fixed.

In the present embodiment, as illustrated in FIG. 2, a flexible resin 50 is filled into sides of the plurality of piezoelectric elements 30 in a space surrounded by the central opening 42 of the lower sealing plate 40.

The flexible resin 50 is, for example, silicone.

With the flexible resin 50, it is possible to effectively block the influence from the outside on the plurality of piezoelectric elements 30.

Further, the vibration attenuation of the piezoelectric elements 30 can be increased, the reverberation of ultrasonic waves generated in a burst shape by the plurality of piezoelectric elements 30 can be suppressed, and a range in which the distance of an object can be detected by a reflected wave can be expanded as much as possible.

The wiring assembly 100 is used for transmitting an applied voltage supplied from the outside to the plurality of piezoelectric elements 30.

Figure 13:
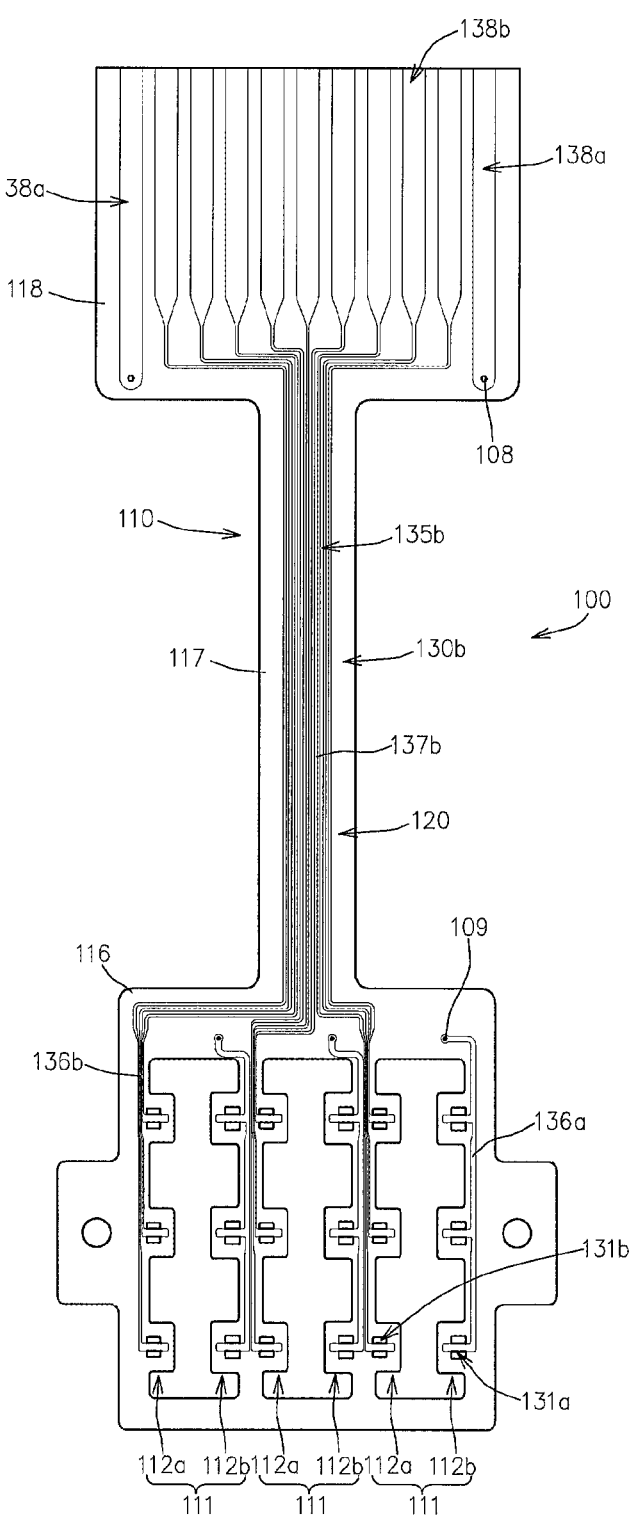
FIG. 13 is a bottom view of the wiring assembly in a state that parts of the components of the wiring assembly are not shown.

FIGS. 12 and 13 illustrate a plan view (a view seen from a side opposite to the piezoelectric element 30) and a bottom view (a view seen from the side of the piezoelectric element 30) of the wiring assembly 100, respectively.

To facilitate understanding, the cover layer 150 described below is omitted in FIGS. 12 and 13.

As illustrated in FIGS. 4, 12, 13, and the like, the wiring assembly 100 includes an insulating base layer 110, the conductor layer 120 fixed to the base layer 110, and the cover layer 150 having insulating properties and enclosing the conductor layer 120 in a state where external connection regions 138a and 138b on the proximal end side and piezoelectric element connection regions 131a and 131b on the distal end side of the conductor layer 120 open outward.

The base layer 110 and the cover layer 150 are formed of an insulating resin such as polyimide, for example.

As illustrated in FIGS. 4, 12, 13, and the like, the base layer 110 includes a plurality of piezoelectric-element overlapping portions 111 that partially overlap with the plurality of piezoelectric elements 30, respectively, in a plan view, and a distal end portion 116 that integrally supports the plurality of piezoelectric-element overlapping portions 111.

In the present embodiment, the base layer 110 further includes a proximal end portion 118 and an intermediate portion 117 that couples the distal end portion 116 and the proximal end portion 118.

The ultrasonic transducer 1 according to the present embodiment includes nine of the piezoelectric elements 30, that is, first to ninth piezoelectric elements 30. Thus, the base layer 110 includes nine of the piezoelectric-element overlapping portions 111 corresponding to the nine piezoelectric elements 30, respectively.

Each of the plurality of piezoelectric-element overlapping portions 111 includes first and second tab regions 112a and 112b respectively corresponding to one electrode and the other electrode of the pair of application electrodes in the corresponding piezoelectric element 30.

As described above, in the present embodiment, the piezoelectric element 30 is a two-layer laminated type piezoelectric element, and the outer electrode formed by the top surface electrode 36 and the bottom surface electrode 37 and the inner electrode 34 interposed in the middle in the thickness direction of the piezoelectric element main body 32 act as the pair of first and second application electrodes.

In this case, the first and second tab regions 112a and 112b act as an outer electrode tab region and an inner electrode tab region, respectively.

Figure 14:
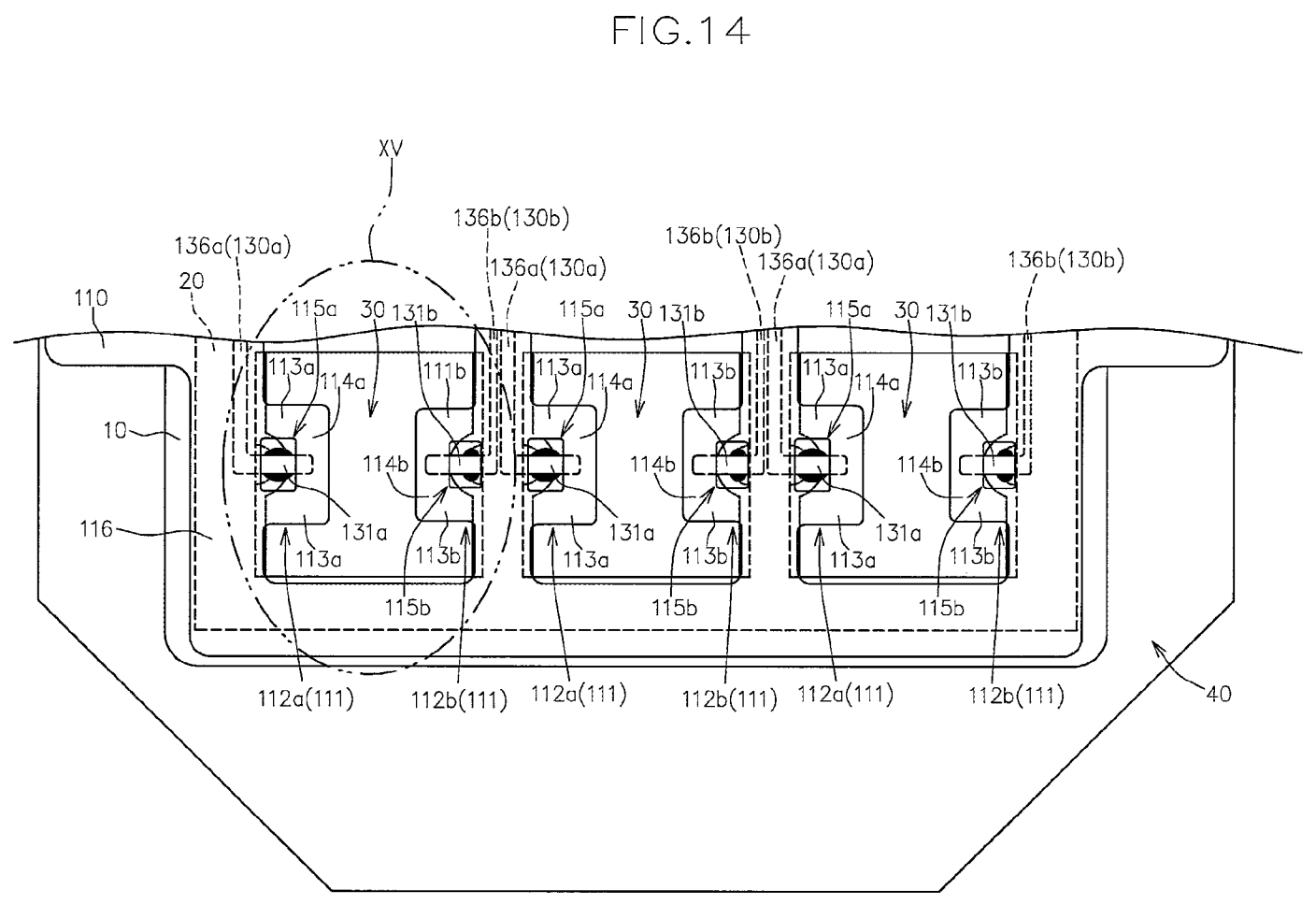

FIG. 14 illustrates a plan view of a part of a preassembly in which the wiring assembly 100 is fixed to the piezoelectric body assembly 3. FIG. 14 corresponds to a state viewed along line XIV-XIV in FIG. 2.

Figure 15:
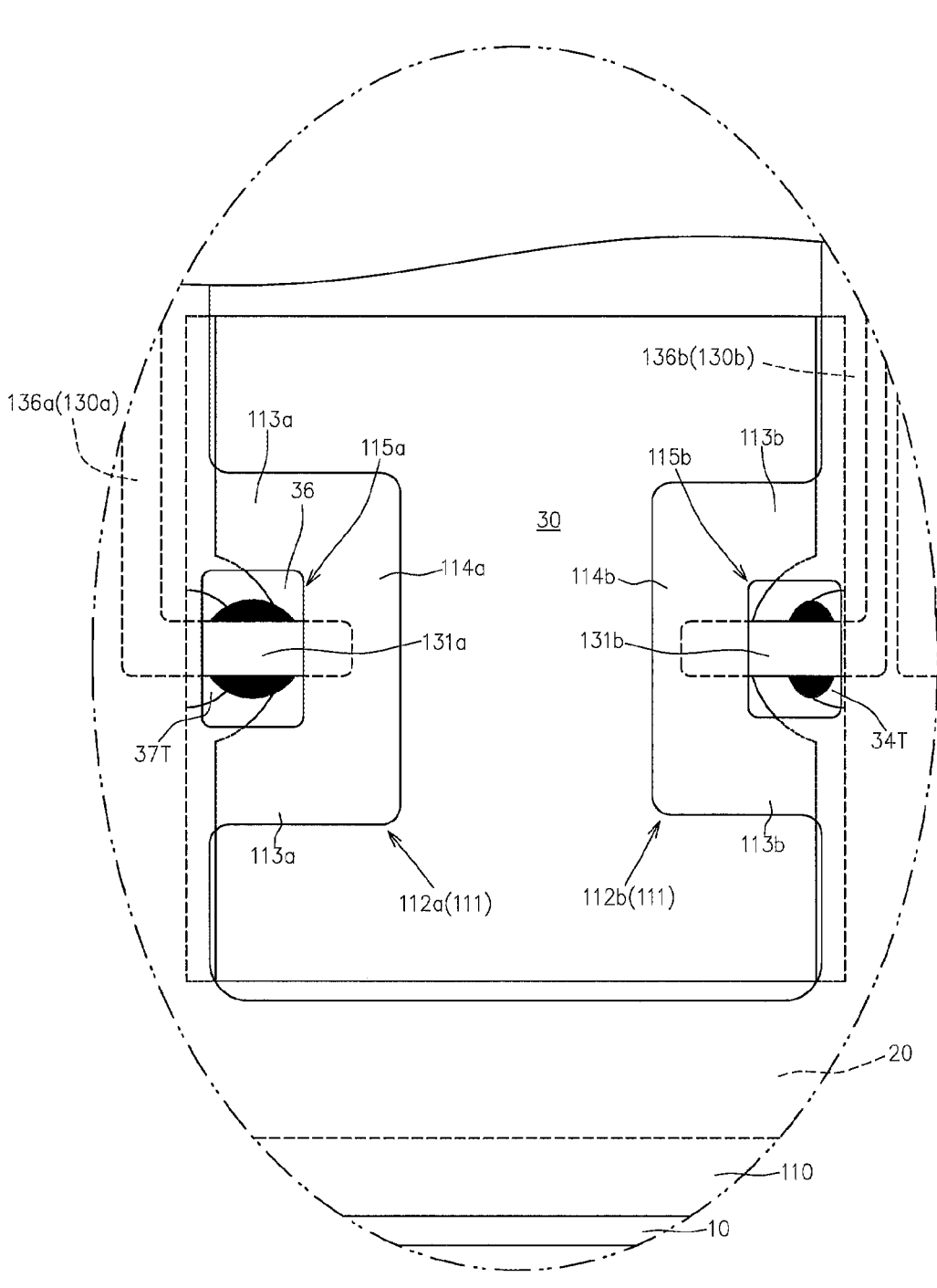
FIG. 15 is an enlarged view of a part XV in FIG. 14.

FIG. 15 illustrates an enlarged view of a part XV in FIG. 14.

As illustrated in FIG. 15, the outer electrode tab region 112a includes a pair of outer electrode extending pieces 113a extending from the distal end portion 116, and an outer electrode coupling piece 114a that couples free end sides of the pair of outer electrode extending pieces 113a and forms an outer electrode connection opening 115a in cooperation with the distal end portion 116 and the pair of outer electrode extending pieces 113a.

Similarly, the inner electrode tab region 112b includes a pair of inner electrode extending pieces 113b extending from the distal end portion 116, and an inner electrode coupling piece 114b that couples free end sides of the pair of inner electrode extending pieces 113b and forms an inner electrode connection opening 115b in cooperation with the distal end portion 116 and the pair of inner electrode extending pieces 113b.

The conductor layer 120 is formed of a conductive metal such as Cu, for example.

The conductor layer 120 may be formed by etching a Cu foil that has a thickness of about 12 to 25 μm and is laminated on the base layer 110 and removing unnecessary portions from the Cu foil.

An exposed portion of Cu forming the conductor layer 120 may be preferably plated with Ni or Au.

In the present embodiment, the conductor layer 120 includes the outer electrode conductor layer 130a and an inner electrode conductor layer 130b respectively connected to the outer electrode and the inner electrode 34 of the plurality of piezoelectric elements 30.

As illustrated in FIGS. 4, 12, and 13, the outer electrode conductor layer 130a includes an external-side terminal region 138a being supported by the proximal end portion 118 of the base layer and receiving a voltage supplied from the outside, a piezoelectric element-side terminal region 131a to be connected to a corresponding electrode of the piezoelectric element 30, and a coupling region 135a extending between the outside terminal region 138a and the piezoelectric element-side terminal region 131a.

Similarly, the inner electrode conductor layer 130b includes an external-side terminal region 138b being supported by the proximal end portion 118 of the base layer and receiving a voltage supplied from the outside, a piezoelectric element-side terminal region 131b to be connected to a corresponding electrode of the piezoelectric element 30, and a coupling region 135b extending between the outside terminal region 138b and the piezoelectric element-side terminal region 131b.

In the present embodiment, the coupling regions 135a and 135b include distal end regions 136a and 136b supported by the distal end portion 116 of the base layer 110 and coupled with the piezoelectric element-side terminal regions 131a and 131b, and intermediate regions 137a and 137b extending between the distal end regions 136a and 136b and the external-side terminal regions 138a and 138b.

As illustrated in FIG. 15 and the like, the piezoelectric element-side terminal region 131a of the outer electrode conductor layer 130a has a bridge shape that extends across the outer electrode connection opening 115a and has a distal end side fixed to the outer electrode coupling piece 114a.

Similarly, the piezoelectric element-side terminal region 131b of the inner electrode conductor layer 130b has a bridge shape that extends across the inner electrode connection opening 115b and has a distal end side fixed to the inner electrode coupling piece 114b.

As illustrated in FIGS. 2, 14, 15, and the like, the wiring assembly 100 is fixed by an adhesive to a top surface of the lower sealing plate 40 in a state where the outer electrode connection opening 115a overlaps with the bottom surface electrode terminal 37T and a part of the top surface electrode 36 of the corresponding piezoelectric element 30, and the inner electrode connection opening 115b overlaps with the inner electrode terminal 34T, in a plan view.

In the present embodiment, as illustrated in FIGS. 2, 4, 14, and the like, the wiring assembly 100 is fixed by an adhesive to the top surface of the lower sealing plate 40 in a state where the cover layer 150 faces the lower sealing plate 40.

Instead of this configuration, the wiring assembly 100 may also be fixed to the top surface of the lower sealing plate 40 in a state where the base layer 110 faces the lower sealing plate 40.

As illustrated in FIGS. 14 and 15, in the preassembly in which the piezoelectric body assembly 3 and the wiring assembly 100 are fixed to each other, a portion of the piezoelectric element-side terminal region 131a of the outer electrode conductor layer 130a that extends across the outer electrode connection opening 115a (hereinafter, referred to as outer electrode conductor bridge portion) is electrically connected to the outer electrode of the corresponding piezoelectric element 30, and a portion of the piezoelectric element-side terminal region 131b of the inner electrode conductor layer 130b that extends across the inner electrode connection opening 115b (hereinafter, referred to as inner electrode conductor bridge portion) is electrically connected to an inner electrode 34 of the corresponding piezoelectric element 30.

Specifically, as illustrated in FIGS. 14 and 15, the outer electrode conductor bridge portion is electrically connected to both a part of the top surface electrode 36 and the bottom surface electrode terminal 37T in the outer electrode connection opening 115a, and the inner electrode conductor bridge portion is electrically connected only to the inner electrode terminal 34T in the inner electrode connection opening 115b.

The electric connection of the outer electrode conductor bridge portion can be realized, for example, by applying a conductive adhesive or solder in the outer electrode connection opening 115a to connect the outer electrode conductor bridge portion, a part of the top surface electrode 36, and the bottom surface electrode terminal 37T, or by ultrasonic bonding between the outer electrode conductor bridge portion and a part of the top surface electrode 36 and between the outer electrode conductor bridge portion and the bottom surface electrode terminal 37T in the outer electrode connection opening 115a.

The electric connection of the inner electrode conductor bridge portion can be realized, for example, by applying a conductive adhesive or solder in the inner electrode connection opening 115b to connect the inner electrode conductor bridge portion to the inner electrode terminal 34T in a state where the inner electrode conductor bridge portion is insulated from the top surface electrode 36, or by connecting the inner electrode conductor bridge portion by ultrasonic bonding to the inner electrode terminal 34T in the inner electrode connection opening 115b in a state where the inner electrode conductor bridge portion is insulated from the top surface electrode 36.

It is possible to visually confirm the state of the electric connection while effectively preventing the piezoelectric element-side terminal regions 131a and 131b from being damaged by performing electrical connections of the outer electrode conductor bridge portion and the inner electrode conductor bridge portion within the corresponding connection openings 115a and 115b in this way.

That is, it is possible to easily confirm an application position and a spreading state of the conductive adhesive or the solder, a contact state of the conductive adhesive or the solder with respect to the bridge portion, a state of a mark resulting from ultrasonic bonding, and the like, so that the occurrence of poor contact can be reduced as much as possible.

In the present embodiment, as illustrated in FIG. 4 and the like, the cover layer 150 has substantially the same configuration as the base layer 110.

Specifically, the cover layer 150 includes a cover-side proximal end portion 158 that covers a part of the external-side terminal regions 138a and 138b, a cover-side distal end portion 156 that covers the distal end regions 136a and 136b, a cover-side intermediate portion 155 that covers the intermediate region 137b, and a cover-side piezoelectric-element overlapping portion 151 overlapping with the piezoelectric-element overlapping portion 111.

The cover-side piezoelectric-element overlapping portion 151 has the same configuration as the piezoelectric-element overlapping portion 111.

That is, the cover-side piezoelectric-element overlapping portion 151 includes a cover-side outer electrode tab region 152a and a cover-side inner electrode tab region 152b that overlap in a plan view with the outer electrode tab region 112a and the inner electrode tab region 112b, respectively.

In this case, the electric connection of the outer electrode conductor bridge portion is realized via the outer electrode connection opening 115a of the outer electrode tab region 112a in the base layer 110 and an outer electrode connection opening 155a of the cover-side outer electrode tab region 152a in the cover layer 150 (see FIG. 4).

Similarly, the electric connection of the inner electrode conductor bridge portion is realized via the inner electrode connection opening 115b of the inner electrode tab region 112b in the base layer 110 and an inner electrode connection opening 155b of the cover-side inner electrode tab region 152b in the cover layer 150 (see FIG. 4).

Preferably, one of the outer electrode conductor layer 130a and the inner electrode conductor layer 130b includes a plurality of individual wirings that are independent from one another and are electrically connected to the corresponding electrodes of the plurality of piezoelectric elements 30, and the other one of the outer electrode conductor layer 130a and the inner electrode conductor layer 130b includes a single wiring connected to the corresponding electrodes of the plurality of piezoelectric elements 30.

According to such a configuration, it is possible to reduce the size of the conductor layer.

As illustrated in FIGS. 4, 12, and 13, in the present embodiment, the outer electrode conductor layer 130a includes a single wiring connected to all outer electrodes of the plurality of piezoelectric elements 30, and the inner electrode conductor layer 130b includes a plurality of individual wirings each independently connected to the corresponding inner electrodes 34 of the plurality of piezoelectric elements 30.

It is noted that, in the present embodiment, the outer electrode conductor layer 130a includes two external-side terminal regions 138a, but one of the two external-side terminal regions 138a may be omitted.

Further, the plurality of individual wirings in one of the outer electrode conductor layer 130a and the inner electrode conductor layer 130b (in the present embodiment, the inner electrode conductor layer 130b) are fixed to a reference surface, which is one of the bottom surface of the base layer 110 facing the piezoelectric element 30 and the top surface of the base layer 110 on the far side from the piezoelectric element 30 (in the present embodiment, the bottom surface), over the entire area from the external-side terminal region 138b to the piezoelectric element-side terminal region 131b.

The single wiring in the other one of the outer electrode conductor layer 130a and the inner electrode conductor layer 130b (in the present embodiment, the outer electrode conductor layer 130a) is fixed to the reference surface of the base layer 110 in the external-side terminal region 138a, is fixed to a back surface opposite to the reference surface of the base layer 110 in the intermediate region 137a, and is fixed to the reference surface of the base layer 110 in the distal end region 136a and the piezoelectric element-side terminal region 131a, so that the intermediate region 137a is electrically connected to the external-side terminal region 138a and the distal end region 136a via through-holes 108 and 109 formed in the base layer 110.

According to such a configuration, it is possible to reduce the size of the wiring assembly 100 while preventing the outer electrode conductor layer 130a and the inner electrode conductor layer 130b from unintentionally making contact with each other.

In this case, the wiring assembly 100 is provided with the back-surface-side cover layer 160 (see FIG. 4) that covers a portion of the conductor layers 130a and 130b provided on the back surface of the base layer 110.

As illustrated in FIGS. 2, 5, and the like, the ultrasonic transducer 1 according to the present embodiment further includes the upper sealing plate 60 fixed to the top surfaces of the lower sealing plate 40 and the wiring assembly 100 via a flexible resin 55.

The upper sealing plate 60 includes opening parts 65 at positions corresponding to the plurality of piezoelectric elements 30.

With the upper sealing plate 60, it is possible to obtain a stable support state of the wiring assembly 100 while preventing an influence on a flexural vibration operation of the vibrating body as much as possible.

For example, the upper sealing plate 60 is formed of a metal such as stainless steel having a thickness of 0.1 mm to 0.3 mm, carbon fiber reinforced plastic, ceramics, and the like.

The ultrasonic transducer 1 according to the present embodiment further includes the sound absorbing material 70 fixed to the top surface of the upper sealing plate 60 by adhesion or the like to cover the plurality of opening parts 65 of the upper sealing plate 60.

The sound absorbing material 70 is formed of a silicone resin having a thickness of about 0.3 mm to 1.5 mm or another foamable resin, for example.

With the sound absorbing material 70, it is possible to effectively prevent ultrasonic waves generated by the piezoelectric elements 30 from being emitted to a side opposite to the side to which the sound waves are to be emitted (lower side in FIG. 2).

The ultrasonic transducer 1 further includes the reinforcing plate 75 fixed to the top surface of the sound absorbing material 70 by adhesion or the like.

For example, the reinforcing plate 75 is formed of a metal such as stainless steel having a thickness of about 0.2 mm to 0.5 mm, carbon fiber reinforced plastic, ceramics, and the like.

With the reinforcing plate 75, it is possible to prevent an external force from affecting the substrate 10 and the piezoelectric elements 30 as much as possible.

The ultrasonic transducer 1 further includes the protective plate 80 fixed to the bottom surface of the substrate 10 by adhesion or the like.

The protective plate 80 includes a plurality of opening parts 82 corresponding to the plurality of opening parts 15 in the substrate 10.

For example, the protective plate 80 is formed of a metal such as stainless steel having a thickness of about 0.1 mm to 0.4 mm, carbon fiber reinforced plastic, ceramics, and the like.

With the protective plate 80, it is possible to effectively prevent damage to the substrate 10 and the flexible resin film 20 from an external force.

From the viewpoint of protecting the substrate 10 and the flexible resin film 20, an opening width of the opening parts 82 of the protective plate 80 is preferably smaller than an opening width of the opening parts 15 of the substrate 10, and is from 60% to 90% of the opening width of the opening parts 15, for example.

For example, when the opening parts of the substrate 10 have a square shape having one side of 3.3 mm, the opening parts 82 of the protective plate 80 may have a square shape having one side of about 2.0 mm to 3.0 mm or a circular shape having a diameter of about 2.0 mm to 3.0 mm.

The vibration and amplitude of the piezoelectric element 30 is small at the peripheral edge of the piezoelectric element 30 and is largest in the central part, and thus, the ultrasonic wave is mainly generated by the vibration in the central part. Therefore, even if the opening width of the opening parts 82 of the protective plate 80 is smaller than the opening width of the opening parts 15 of the substrate 10, there is substantially no effect on the sound pressure of the ultrasonic wave generated and emitted by the piezoelectric element 30.

A manufacturing method of the ultrasonic transducer 1 according to the present embodiment will be described below.

The manufacturing method includes a rigid substrate forming step of forming the rigid substrate 10 including the plurality of opening parts 15 by etching a rigid plate material, a flexible resin film fixing step of fixing the flexible resin film 20 to the top surface of the rigid substrate 10 by an adhesive or by thermocompression bonding to cover the plurality of opening parts 15, a piezoelectric body assembly forming step of forming the piezoelectric body assembly 3 by fixing the plurality of piezoelectric elements 30 to the top surface of the flexible resin film 20 by an insulating adhesive so that the plurality of the piezoelectric elements 30 overlap with the plurality of opening parts 15, respectively, in a plan view, a lower sealing plate arranging step of fixing the lower sealing plate 40 to the top surface of the flexible resin film 20 by an adhesive so that the central opening 42 surrounds the opening part forming region 12 in a plan view, a wiring assembly preparation step of preparing the wiring assembly 100, a wiring assembly fixing step of fixing the wiring assembly 100 to the top surface of the lower sealing plate 40 by an insulating adhesive in a state where the outer electrode connection opening 115a overlaps with a part of the top surface electrode 36 and the bottom surface electrode terminal 37T of the corresponding piezoelectric element 30, and the inner electrode connection opening 115b overlaps with the inner electrode terminal 34T of the corresponding piezoelectric element 30 in a plan view, and an electric connection step of electrically connecting the bridge portion of the piezoelectric element-side terminal region 131a of the outer electrode conductor layer 130a to both a part of the top surface electrode 36 and the bottom surface electrode terminal 37T of the corresponding piezoelectric element 30, and electrically connecting the bridge portion of the piezoelectric element-side terminal region 131b of the inner electrode conductor layer 130b to the inner electrode terminal 34T of the corresponding piezoelectric element 30.

Preferably, the manufacturing method may include a joining step in which the wiring assembly fixing step and the electric connection step are collectively performed at the same time.

The joining step includes a process of applying a thermosetting insulating adhesive to a portion of the top surface of the lower sealing plate 40 where the wiring assembly 100 is located, a process of applying a thermosetting conductive adhesive to extend across a part of the top surface electrode 36 and the bottom surface electrode terminal 37T of the piezoelectric element 30, a process of applying a thermosetting conductive adhesive to the inner electrode terminal 34T of the piezoelectric element 30, a process of forming a preassembly by arranging the wiring assembly 100 at a predetermined position on the top surface of the lower sealing plate 40, and a process of curing the thermosetting insulating adhesive and the thermosetting conductive adhesive by heating and treating the preassembly at about 120° C. to 150° C. during several tens of minutes, for example.

With the joining step, it is possible to fix the wiring assembly 100 to the lower sealing plate 40 and electrically connect the wiring assembly 100 with the piezoelectric element 30 at the same time, so that the efficiency can be improved.

Needless to say, the electric connection step may be performed after the wiring assembly fixing step.

In this case, the electric connection step includes a process of electrically connecting the bridge portion of the piezoelectric element-side terminal region 131a of the outer electrode conductor layer 130a to both a part of the top surface electrode 36 and the bottom surface electrode terminal 37T of the corresponding piezoelectric element 30 by a conductive adhesive, solder, or ultrasonic bonding in a state where the wiring assembly 100 adheres to the lower sealing plate 40 by an adhesive, and a process of electrically connecting the bridge portion of the piezoelectric element-side terminal region 131b of the inner electrode conductor layer 130b to the inner electrode terminal 34T of the corresponding piezoelectric element 30 by a conductive adhesive, solder, or ultrasonic bonding.

The manufacturing method further includes, after the lower sealing plate arranging step and before the wiring assembly fixing step, a sealing resin arranging step of providing a thermosetting sealing resin such as a liquid silicone resin into side portions of the plurality of piezoelectric elements in a space defined by the central opening of the lower sealing plate, and curing the thermosetting sealing resin by heating, for example, at about 100° C. to 150° C. during several tens of minutes.

The manufacturing method further includes a protective plate fixing step of fixing the protective plate 80 at any timing after the piezoelectric body assembly forming step.

The configuration of the protective plate fixing step is such that the protective plate 80 is fixed to the bottom surface of the rigid substrate 10 by an adhesive.

The manufacturing method further includes, after the electric connection step, an upper sealing plate arranging step of arranging the upper sealing plate 60.

The upper sealing plate arranging step includes a process of applying a thermosetting type flexible resin such as a silicone resin to the top surface of the wiring assembly 100, a process of arranging the upper sealing plate 60 on the flexible resin, and a process of curing the flexible resin by heating the flexible resin at about 100° C. to 150° C. during several tens of minutes, for example.

The manufacturing method further includes, after the upper sealing plate arranging step, a step of arranging the sound absorbing material 70 and a step of arranging the reinforcing plate 75.

The sound absorbing material arranging step includes a process of applying a thermosetting insulating adhesive to the top surface of the upper sealing plate 60, a process of arranging the sound absorbing material 70 such as a silicone resin or another foamable resin on the thermosetting insulating adhesive, and a process of curing the thermosetting insulating adhesive by heating the thermosetting insulating adhesive at about 120° C. to 150° C. during several tens of minutes, for example.

The reinforcing plate arranging step includes a process of applying a thermosetting insulating adhesive to the top surface of the sound absorbing material 70, a process of arranging the reinforcing plate 75 on the thermosetting insulating adhesive, and a process of curing the thermosetting insulating adhesive by heating the thermosetting insulating adhesive at about 120° C. to 150° C. during several tens of minutes, for example.

DESCRIPTION OF THE REFERENCE NUMERALS 1 ultrasonic transducer
10 rigid substrate
12 opening part forming region
20 flexible resin film
30 piezoelectric element
40 lower sealing plate
42 central opening
50, 55 flexible resin
60 upper sealing plate
65 opening part
70 sound absorbing material
75 reinforcing plate
80 protective plate
82 opening part
100 wiring assembly
108, 109 through-hole
110 base layer
111 piezoelectric-element overlapping portion
116 distal end portion
112a outer electrode tab region (first tab region)
112b inner electrode tab region (second tab region)
115a outer electrode connection opening (connection opening in first tab region)
115b inner electrode connection opening (connection opening in second tab region)
116 distal end portion
117 intermediate portion
118 proximal end portion
120 conductor layer
130a outer electrode conductor layer (first conductor layer)
130b inner electrode conductor layer (second conductor layer)
131a, 131b piezoelectric element-side terminal region
136a, 136b distal end region
137a, 137b intermediate region
138a, 138b external-side terminal region
150 cover layer
152a cover-side outer electrode tab region (cover-side first tab region)
152b cover-side inner electrode tab region (cover-side second tab region)
156 cover-side distal end portion
160 back-surface-side cover layer

The invention claimed is:

1. An ultrasonic transducer comprising:

a rigid substrate comprising a plurality of opening parts penetrating the rigid substrate between a bottom surface and a top surface thereof;

a flexible resin film that is fixed to the top surface of the substrate so as to cover the plurality of opening parts; and a plurality of piezoelectric elements that are fixed to a top surface of the resin film so as to overlap with the plurality of opening parts, respectively, in a plan view, wherein the flexible resin film is formed of polyimide having a thickness of 25 μm to 75 μm.

2. The ultrasonic transducer according to claim 1, wherein an arrangement pitch of the plurality of piezoelectric elements is equal to or less than 4.3 mm, and wherein the piezoelectric element has a rectangular shape in the plan view having longitudinal and lateral dimensions in the plan view with a maximum value of 4.0 mm or less, a circular shape in the plan view having a diameter of 4.0 mm or less, or an elliptical shape in the plan view having a major axis of 4.0 mm or less.

3. The ultrasonic transducer according to claim 2, wherein the piezoelectric element is arranged so that its entire circumference is overlapped with the rigid substrate in the plan view; and wherein an overlapping width between the piezoelectric element and the rigid substrate is set to be 0.03 mm to 0.07 mm.

4. The ultrasonic transducer according to claim 1, wherein the piezoelectric element is of a laminated type.

5. The ultrasonic transducer according to claim 1, further comprising a protective plate fixed to a bottom surface of the substrate, wherein the protective plate is provided with a plurality of opening parts corresponding to the plurality of opening parts in the substrate.

6. An ultrasonic transducer, comprising:

a rigid substrate comprising a plurality of opening parts penetrating the rigid substrate between a bottom surface and a top surface thereof;

a flexible resin film that is fixed to the top surface of the substrate so as to cover the plurality of opening parts;

a plurality of piezoelectric elements that are fixed to a top surface of the resin film so as to overlap with the plurality of opening parts, respectively, in a plan view;

a lower sealing plate that includes a central opening with a size surrounding an opening part forming region in which the plurality of opening parts of the rigid substrate are formed, and that is fixed to the top surface of the flexible resin film so that the central opening surrounds the opening part forming region in the plan view; and a wiring assembly fixed to a top surface of the lower sealing plate, wherein the wiring assembly includes an insulating base layer, first and second conductor layers that are arranged on the base layer and are electrically connected to a pair of first and second application electrodes, respectively, of the piezoelectric element, and an insulative cover layer, wherein each of the first and second conductor layers has an external-side terminal region and a piezoelectric element-side terminal region, and wherein the cover layer encloses the first and second conductor layers in a state where at least the external-side terminal region and the piezoelectric element-side terminal region are accessible.

7. The ultrasonic transducer according to claim 6, wherein the base layer includes a plurality of piezoelectric-element overlapping portions that partially overlap with the plurality of piezoelectric elements, respectively, in the plan view, and a distal end portion that integrally supports the plurality of piezoelectric-element overlapping portions, wherein the piezoelectric-element overlapping portion includes first and second tab regions respectively corresponding to the first and second application electrodes of the corresponding piezoelectric element, wherein each of the first and second tab regions has a connection opening, wherein the piezoelectric element-side terminal region of the first conductor layer has a bridge shape that extends across the connection opening of the first tab region and is supported at a distal end side by the first tab region, wherein the piezoelectric element-side terminal region of the second conductor layer has a bridge shape that extends across the connection opening of the second tab region and is supported at a distal end side by the second tab region, wherein the piezoelectric element is configured so that the first and second application electrodes can be electrically connected from the upper side, wherein the wiring assembly is fixed to a top surface of the lower sealing plate in a state where the connection opening of the first tab region overlaps with an electrical connectable portion of the first application electrode in the plan view and the connection opening of the second tab region overlaps with an electrical connectable portion of the second application electrode in the plan view, wherein a portion of the piezoelectric element-side terminal region of the first conductor layer that extends across the connection opening of the first tab region is electrically connected to the electrical connectable portion of the first application electrode of the corresponding piezoelectric element, and wherein a portion of the piezoelectric element-side terminal region of the second conductor layer that extends across the connection opening of the second tab region is electrically connected to the electrical connectable portion of the second application electrode of the corresponding piezoelectric element.

8. The ultrasonic transducer according to claim 7, wherein the cover layer includes a cover-side first tab region, a cover-side second tab region and a cover-side distal end portion that correspond to the first tab region, the second tab region and the distal end portion of the base layer, respectively.

9. The ultrasonic transducer according to claim 7, wherein the electrical connection of the piezoelectric element-side terminal region of the first conductor layer with respect to the electrical connectable portion of the first application electrode of the corresponding piezoelectric element, and the electrical connection of the piezoelectric element-side terminal region of the second conductor layer with respect to the electrical connectable portion of the second application electrode of the corresponding piezoelectric element are realized by conductive adhesive, solder or ultrasonic bonding.

10. The ultrasonic transducer according to claim 6, wherein sides of the plurality of piezoelectric elements in a space surrounded by the central opening of the lower sealing plate are filled with flexible resin.

11. The ultrasonic transducer according to claim 6, further comprising an upper sealing plate fixed to the top surfaces of the lower sealing plate and the wiring assembly via a flexible resin, wherein the upper sealing plate is provided with opening parts at positions corresponding to the plurality of piezoelectric elements.

12. The ultrasonic transducer according to claim 11, further comprising a sound absorbing material fixed to a top surface of the upper sealing plate so as to cover the plurality of opening parts of the upper sealing plate.

13. The ultrasonic transducer according to claim 12, further comprising a reinforcing plate fixed to a top surface of the sound absorbing material.

14. An ultrasonic transducer comprising:

a rigid substrate that is provided with a plurality of opening parts penetrating the rigid substrate between a bottom surface and a top surface thereof, a flexible resin film that is fixed to the top surface of the substrate so as to cover the plurality of opening parts;

a plurality of piezoelectric elements that are fixed to a top surface of the resin film so as to overlap with the plurality of opening parts, respectively, in a plan view;

a lower sealing plate that includes a central opening with a size surrounding an opening part forming region in which the plurality of opening parts of the rigid substrate are formed, and that is fixed to the top surface of the flexible resin film so that the central opening surrounds the opening part forming region in the plan view; and a wiring assembly fixed to a top surface of the lower sealing plate, wherein the piezoelectric element includes a piezoelectric element main body, an inner electrode that partitions the piezoelectric element main body into a first piezoelectric portion on an upper side and a second piezoelectric portion on a lower side in a thickness direction, a top surface electrode fixed to a part of a top surface of the first piezoelectric portion, a bottom surface electrode that is fixed to a bottom surface of the second piezoelectric portion and forms an outer electrode along with the top surface electrode, an inner electrode connection member of which one end part is electrically connected to the inner electrode and the other end part forms an inner electrode terminal accessible at the top surface of the first piezoelectric portion while being insulated from the top surface electrode, and a bottom surface electrode connection member of which one end part is electrically connected to the bottom surface electrode and the other end part forms a bottom surface electrode terminal accessible at the top surface of the first piezoelectric portion while being insulated from the top surface electrode and the inner electrode, wherein the wiring assembly includes an insulating base layer, an outer electrode conductor layer and an inner electrode conductor layer arranged on the base layer, each of which has an external-side terminal region and a piezoelectric element-side terminal region, and a cover layer that encloses the outer electrode conductor layer and the inner electrode conductor layer in a state where at least the external-side terminal region and the piezoelectric element-side terminal region are accessible, wherein the base layer includes a plurality of piezoelectric-element overlapping portions that partially overlap with the plurality of piezoelectric elements, respectively, in a plan view, and a distal end portion that integrally supports the plurality of piezoelectric-element overlapping portions, wherein the piezoelectric-element overlapping portion includes an outer electrode tab region having an outer electrode connection opening and an inner electrode tab region having an inner electrode connection opening, wherein the piezoelectric element-side terminal region of the outer electrode conductor layer has a bridge shape that extends across the outer electrode connection opening and is supported at a distal end side by the outer electrode tab region, wherein the piezoelectric element-side terminal region of the inner electrode conductor layer has a bridge shape that extends across the inner electrode connection opening and is supported at a distal end side by the inner electrode tab region, wherein the wiring assembly is fixed to a top surface of the lower sealing plate in a state where the outer electrode connection opening overlaps, in the plan view, with a part of the top surface electrode and the bottom surface electrode terminal of the corresponding piezoelectric element and the inner electrode connection opening overlaps, in the plan view, with the inner electrode terminal of the corresponding the piezoelectric element, wherein a portion of the piezoelectric element-side terminal region of the outer electrode conductor layer that extends across the outer electrode connection opening is electrically connected to the part of the top surface electrode and the bottom surface electrode terminal of the corresponding piezoelectric element, and wherein a portion of the piezoelectric element-side terminal region of the inner electrode conductor layer that extends across the inner electrode connection opening is electrically connected to the inner electrode terminal of the corresponding piezoelectric element.

15. The ultrasonic transducer according to claim 14, wherein the cover layer includes a cover-side outer electrode tab region, a cover-side inner electrode tab region and a cover-side distal end portion that correspond to the outer electrode tab region, the inner electrode tab region and the distal end portion of the base layer, respectively.

16. The ultrasonic transducer according to claim 15, wherein the electrical connection of the piezoelectric element-side terminal region of the outer electrode conductor layer with respect to the part of the top surface electrode and the bottom surface electrode terminal of the corresponding piezoelectric element, and the electrical connection of the piezoelectric element-side terminal region of the inner electrode conductor layer with respect to the inner electrode terminal of the corresponding piezoelectric element are realized by conductive adhesive, solder or ultrasonic bonding.

17. The ultrasonic transducer according to claim 15, wherein one of the outer electrode conductor layer and the inner electrode conductor layer includes a plurality of individual wirings that are independent from one another and are electrically connected to the corresponding electrodes of the plurality of piezoelectric elements, respectively, and wherein the other one of the outer electrode conductor layer and the inner electrode conductor layer includes a single wiring connected to the corresponding electrodes of the plurality of piezoelectric elements.

18. The ultrasonic transducer according to claim 17, wherein the base layer includes, in addition to the distal end portion and the plurality of piezoelectric-element overlapping portions, a proximal end portion that supports the external-side terminal regions of the outer electrode conductor layer and the inner electrode conductor layer and an intermediate portion that couples the distal end portion and the proximal end portion, wherein each of the wirings of the outer electrode conductor layer and the inner electrode conductor layer includes, in addition to the external-side terminal region and the piezoelectric element-side terminal region, a distal end region supported by the distal end portion and connected with a proximal side of the piezoelectric element-side terminal region, and an intermediate region supported by the intermediate portion and connecting the distal end region and the external-side terminal region, wherein the plurality of individual wirings in one of the outer electrode conductor layer and the inner electrode conductor layer are fixed to a reference surface, which is one of the bottom surface of the base layer facing the piezoelectric element and the top surface of the base layer on the far side from the piezoelectric element, over the entire area from the external-side terminal region to the piezoelectric element-side terminal region, wherein the single wiring in the other one of the outer electrode conductor layer and the inner electrode conductor layer is configured so that the external-side terminal region is fixed to the reference surface of the base layer, the intermediate region is fixed to a back surface opposite to the reference surface of the base layer, the distal end region and the piezoelectric element-side terminal region are fixed to the reference surface of the base layer, and the intermediate region is electrically connected to the external-side terminal region and the distal end region via through-holes formed in the base layer.

19. A manufacturing method of an ultrasonic transducer comprising:
a rigid substrate forming step of forming a rigid substrate including a plurality of opening parts that penetrate the rigid substrate between a bottom surface and a top surface thereof by etching a rigid plate material;
a flexible resin film fixing step of fixing a flexible resin film to the top surface of the rigid substrate so as to cover the plurality of opening parts by an adhesive or by thermocompression bonding;
a piezoelectric body assembly forming step of preparing a plurality of two-layer laminated type piezoelectric elements each configured so that a top surface electrode, a bottom surface electrode terminal electrically connected to a bottom surface electrode that forms an outer electrode along with the top surface electrode and an inner electrode terminal electrically connected to an inner electrode are accessible from the upper side, and then fixing the plurality of piezoelectric elements to the top surface of the flexible resin film by an insulating adhesive so that the plurality of the piezoelectric elements overlap with the plurality of opening parts, respectively, in a plan view to form a piezoelectric body assembly;
a lower sealing plate arranging step of preparing a lower sealing plate that includes a central opening having a size surrounding an opening part forming region in which the plurality of opening parts of the rigid substrate are formed, and then fixing the lower sealing plate to the top surface of the flexible resin film by an adhesive so that the central opening surrounds the opening part forming region in the plan view,
a wiring assembly preparation step of preparing a wiring assembly that includes an insulating base layer, an outer electrode conductor layer and an inner electrode conductor layer arranged on the base layer, each of which has an external-side terminal region and a piezoelectric element-side terminal region, and a cover layer that encloses the outer electrode conductor layer and the inner electrode conductor layer in a state where at least the external-side terminal region and the piezoelectric element-side terminal region are accessible, wherein the base layer includes a plurality of piezoelectric-element overlapping portions that partially overlap with the plurality of piezoelectric elements, respectively, in the plan view, and a distal end portion that integrally supports the plurality of piezoelectric-element overlapping portions, wherein the piezoelectric-element overlapping portion includes an outer electrode tab region having an outer electrode connection opening and an inner electrode tab region having an inner electrode connection opening, wherein the piezoelectric element-side terminal region of the outer electrode conductor layer has a bridge shape that extends across the outer electrode connection opening and is supported at a distal end side by the outer electrode tab region, wherein the piezoelectric element-side terminal region of the inner electrode conductor layer has a bridge shape that extends across the inner electrode connection opening and is supported at a distal end side by the inner electrode tab region;
a wiring assembly fixing step of fixing the wiring assembly to the top surface of the lower sealing plate by an insulating adhesive in a state where the outer electrode connection opening overlaps in a plan view with a part of the top surface electrode and the bottom surface electrode terminal of the corresponding piezoelectric element, and the inner electrode connection opening overlaps in a plan view with the inner electrode terminal of the corresponding piezoelectric element;
an electric connection step of electrically connecting a bridge portion of the piezoelectric element-side terminal region of the outer electrode conductor layer to both a part of the top surface electrode and the bottom surface electrode terminal of the corresponding piezoelectric element, and electrically connecting a bridge portion of the piezoelectric element-side terminal region of the inner electrode conductor layer to the inner electrode terminal of the corresponding piezoelectric element,
wherein the wiring assembly preparation step is performed independently from the rigid substrate forming step, the flexible resin film fixing step, the piezoelectric body assembly forming step and the lower sealing plate arranging step, at least before the wiring assembly fixing step.

20. The manufacturing method of the ultrasonic transducer according to claim 19 further comprising a joining step in which the wiring assembly fixing step and the electric connection step are collectively performed at the same time, wherein the joining step includes:
a process of applying a thermosetting insulating adhesive to a portion of the top surface of the lower sealing plate where the wiring assembly is located;

a process of applying a thermosetting conductive adhesive so as to extend across the part of the top surface electrode and the bottom surface electrode terminal of the piezoelectric element;

a process of applying a thermosetting conductive adhesive to the inner electrode terminal of the piezoelectric element;

a process of forming a preassembly by arranging the wiring assembly at a predetermined position on the top surface of the lower sealing plate; and a process of curing the thermosetting insulating adhesive and the thermosetting conductive adhesive by heating and treating the preassembly.

21. The manufacturing method of the ultrasonic transducer according to claim 19, wherein the electric connection step includes:

a process of electrically connecting a bridge portion of the piezoelectric element-side terminal region of the outer electrode conductor layer to both the part of the top surface electrode and the bottom surface electrode terminal of the piezoelectric element by solder or ultrasonic bonding; and a process of electrically connecting a bridge portion of the piezoelectric element-side terminal region of the inner electrode conductor layer to the inner electrode terminal of the piezoelectric element by solder or ultrasonic bonding.

22. The manufacturing method of the ultrasonic transducer according to claim 19 further comprising a sealing resin arranging step of providing a thermosetting sealing resin into side portions of the plurality of piezoelectric elements in a space defined by the central opening of the lower sealing plate, and curing the thermosetting sealing resin by heating, after the lower sealing plate arranging step and before the wiring assembly fixing step.

23. The manufacturing method of the ultrasonic transducer according to claim 19 further comprising a protective plate fixing step performed at any timing after the piezoelectric body assembly forming step, wherein the protective plate fixing step is configured to prepare a rigid protective plate including a plurality of protective-plate opening parts corresponding to the plurality of opening parts in the rigid substrate, and fix the protective plate to the bottom surface of the rigid substrate by an adhesive.

24. The manufacturing method of the ultrasonic transducer according to claim 19 further comprising an upper sealing plate arranging step performed after the electric connection step, wherein the upper sealing plate arranging step includes:

a process of applying a thermosetting type flexible resin to the top surface of the wiring assembly;

a process of arranging a rigid upper sealing plate on the flexible resin, the upper sealing plate including opening parts at positions corresponding to the plurality of piezoelectric elements; and a process of curing the flexible resin by heating.

25. The manufacturing method of the ultrasonic transducer according to claim 24 further comprising a sound absorbing material arranging step and a reinforcing plate arranging step performed after the upper sealing plate arranging step, wherein the sound absorbing material arranging step includes:

a process of applying a thermosetting insulating adhesive to the top surface of the upper sealing plate;

a process of arranging a sound absorbing material on the thermosetting insulating adhesive; and a process of curing the thermosetting insulating adhesive by heating, and, wherein the reinforcing plate arranging step includes:

a process of applying a thermosetting insulating adhesive to the top surface of the sound absorbing material;

a process of arranging a rigid reinforcing plate on the thermosetting insulating adhesive; and a process of curing the thermosetting insulating adhesive by heating.

* * * * *